United States Patent
Zhu et al.

(10) Patent No.: US 9,269,492 B2
(45) Date of Patent: Feb. 23, 2016

(54) BONE FRAME, LOW RESISTANCE VIA COUPLED METAL OXIDE-METAL (MOM) ORTHOGONAL FINGER CAPACITOR

(71) Applicant: QUALCOMM Incorporated, San Diego, CA (US)

(72) Inventors: John J. Zhu, San Diego, CA (US); Pr Chidambaram, San Diego, CA (US); Lixin Ge, San Diego, CA (US); Bin Yang, San Diego, CA (US); Jihong Choi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 142 days.

(21) Appl. No.: 13/799,079

(22) Filed: Mar. 13, 2013

(65) Prior Publication Data

US 2014/0092523 A1    Apr. 3, 2014

Related U.S. Application Data

(60) Provisional application No. 61/708,788, filed on Oct. 2, 2012.

(51) Int. Cl.
| | |
|---|---|
| *H01G 4/012* | (2006.01) |
| *H01G 4/38* | (2006.01) |
| *H01G 4/005* | (2006.01) |
| *H01L 49/02* | (2006.01) |
| *H01G 4/33* | (2006.01) |
| *H01G 4/10* | (2006.01) |

(52) U.S. Cl.
CPC ............... *H01G 4/012* (2013.01); *H01G 4/005* (2013.01); *H01G 4/10* (2013.01); *H01G 4/33* (2013.01); *H01G 4/38* (2013.01); *H01L 28/86* (2013.01)

(58) Field of Classification Search
CPC ........... H01G 4/012; H01G 4/10; H01G 4/33; H01G 4/38; H01G 4/005; H01L 28/86
See application file for complete search history.

(56) References Cited

U.S. PATENT DOCUMENTS

| | | | |
|---|---|---|---|
| 7,561,407 B1 * | 7/2009 | Chen et al. | 361/306.1 |
| 8,558,346 B1 * | 10/2013 | Cheng et al. | 257/532 |
| 8,916,919 B2 * | 12/2014 | Thompson et al. | 257/307 |
| 2002/0113292 A1 * | 8/2002 | Appel | 257/532 |
| 2003/0030474 A1 * | 2/2003 | McGowan | 327/202 |
| 2004/0174655 A1 * | 9/2004 | Tsai et al. | 361/306.3 |
| 2005/0167702 A1 * | 8/2005 | Booth et al. | 257/207 |
| 2005/0227441 A1 * | 10/2005 | Nakamura et al. | 438/287 |
| 2008/0239619 A1 * | 10/2008 | Okamoto et al. | 361/303 |
| 2009/0002916 A1 * | 1/2009 | Wei et al. | 361/303 |
| 2009/0290283 A1 * | 11/2009 | Fong et al. | 361/306.2 |

(Continued)

*Primary Examiner* — David M Sinclair
(74) *Attorney, Agent, or Firm* — Xiaotun Qiu

(57) ABSTRACT

An orthogonal finger capacitor includes a layer having an anode bone frame adjacent a cathode bone frame, the anode bone frame having a first portion extending along an axis and a second portion extending perpendicular to the axis. A set of anode fingers extends from the first portion. A set of cathode fingers extends from the cathode bone frame, interdigitated with the set of anode fingers. An overlaying layer has another anode bone frame having a first portion parallel to the axis and a perpendicular second portion. A via couples the overlaying anode bone frame to the underlying anode bone frame. The via is located where the first portion of the overlaying anode bone frame overlaps the second portion of the underlying anode bone frame or, optionally, where the second portion of the overlaying anode bone frame overlaps the first portion of the underlying anode bone frame.

22 Claims, 15 Drawing Sheets

(56) References Cited

U.S. PATENT DOCUMENTS

| | | | |
|---|---|---|---|
| 2010/0067169 A1* | 3/2010 | Wang | 361/303 |
| 2011/0049674 A1* | 3/2011 | Booth et al. | 257/532 |
| 2012/0092806 A1* | 4/2012 | Hua et al. | 361/306.3 |

* cited by examiner

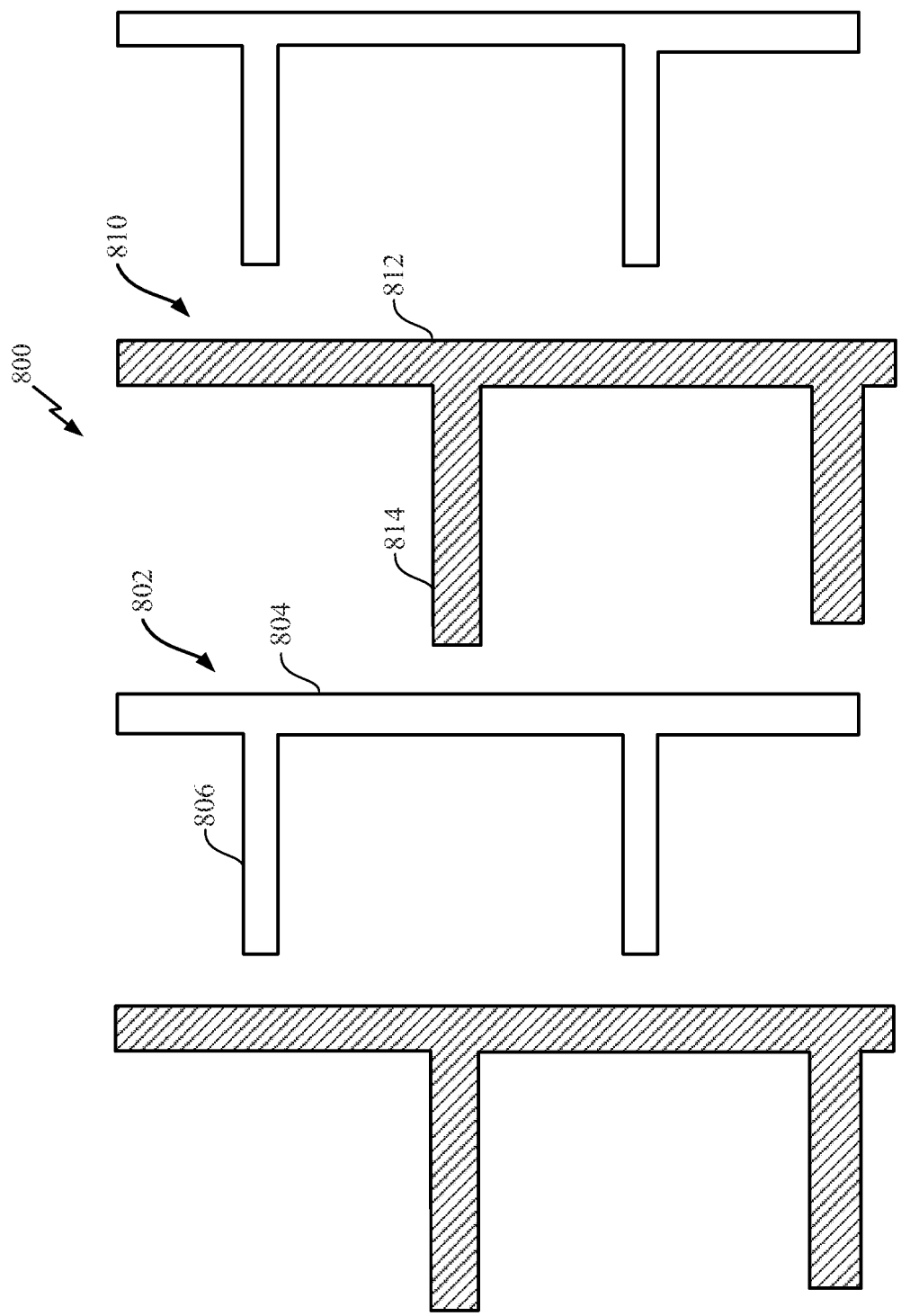

BONE FRAME, LOW RESISTANCE VIA COUPLED METAL OXIDE-METAL (MOM) ORTHOGONAL FINGER CAPACITOR

CLAIM OF PRIORITY UNDER 35 U.S.C. §119

The present Application for Patent claims priority to Provisional Application No. 61/708,788 entitled "Bone Frame, Low Resistance Via Coupled Metal Oxide-Metal (MOM) Orthogonal Finger Capacitor," filed Oct. 2, 2012, and assigned to the assignee hereof, which is hereby incorporated by reference in its entirety.

FIELD OF DISCLOSURE

The present invention relates to integrated circuit design and fabrication, and more particularly to the structure and fabrication of metal-oxide-metal finger capacitors.

BACKGROUND

Metal-oxide-metal (MOM) (or more generally metal-dielectric-metal) capacitors are a known device for use in integrated circuits, and commonly include multiple layers of patterned metal conductors with intervening layers of metal oxide or other insulating dielectric materials to prevent unwanted shorts between successive conductor layers. For brevity, the term "MOM" is hereby defined and shall be understood to mean "metal-dielectric-metal," except in instances where expressly stated otherwise or made clear from the context to have a different meaning, where 'dielectric' may be, for example, an insulating dielectric material such as a metal oxide." For like reasons, reference in this description to an "oxide" layer of a "MOM" structure will be understood to mean a reference to an "insulating dielectric layer," for example a "metal oxide."

One known type of MOM capacitor is generally termed a MOM "finger capacitor." One general structure of a MOM finger capacitor is two comb-like conductor patterns, each comprising a set of fingers extending from a frame, aligned such that the two sets of fingers are parallel and interdigitated. One of the comb-like structures is an "anode" and the other a "cathode," The interdigitated fingers thereby form a plurality of finger pairs, each comprising one anode finger extending parallel to one cathode finger. Each of these pairs, in turn, forms a capacitor element, often termed a "sub-capacitor." The total capacitance of the interdigitated arrangement is, to a first order approximation, the sum of the sub-capacitors.

As known in the conventional IC capacitor arts, design and fabrication targets of MOM finger capacitors can include high capacitance density, meaning high capacitance per unit area occupied on the IC, and a low real resistance. As also known in the conventional arts, constraints can arise in design and fabrication toward these and other targets. For example, adjusting values of certain structural parameters of conventional MOM finger capacitors to increase capacitor density can create an unwanted increase in real resistance and/or reduction of reliability.

SUMMARY

The following summary is not an extensive overview of all contemplated aspects, and is not intended to identify key or critical elements of all aspects nor delineate the scope of any aspect.

One exemplary embodiment may provide an orthogonal finger capacitor having an anode bone frame having an anode spine that extends along a longitudinal axis, and an anode rib connected to the anode spine, a set of anode fingers that extends from one from among the anode spine and the anode rib, a cathode bone frame having a cathode spine that extends parallel to the longitudinal axis and having a cathode rib connected to the cathode spine, and a set of cathode fingers that extends from one among the cathode spine and the cathode rib and that is interdigitated with the set of anode fingers.

In an aspect, the anode bone frame, the set of anode fingers, the cathode bone frame and the set of cathode fingers may be located in the same given metal layer.

In a further aspect, the orthogonal finger capacitor in accordance with an exemplary embodiment may farther include an insulating dielectric on the anode bone frame, the set of anode fingers, the cathode bone frame, and the set of cathode fingers, an overlaying anode bone frame, in an overlaying metal layer above the insulating dielectric and the given metal layer, having an overlaying anode spine and an overlaying anode rib, wherein at least a segment of the overlaying anode rib may be above and extend in alignment with the anode spine, and at least a segment of the overlaying anode spine may extend above and in alignment with the anode rib, and an anode via coupling the anode bone frame to the overlaying anode bone frame.

In another aspect, the orthogonal finger capacitor in accordance with an exemplary embodiment may further include an overlaying cathode bone frame in the overlaying metal layer, having an overlaying cathode spine and an overlaying cathode rib, wherein at least a segment of the overlaying cathode rib may be above and extend in alignment with the cathode spine, and at least a segment of the overlaying cathode spine may extend above and in alignment with the cathode rib, and a cathode via coupling the cathode bone frame to the overlaying cathode bone frame.

According to one exemplary embodiment, an orthogonal finger capacitor may further include an insulating dielectric on the anode bone frame, the set of anode fingers, the cathode bone frame, and the set of cathode fingers.

In an aspect, the anode bone frame may be a first anode bone frame, the anode spine a first anode spine that extends parallel to a reference axis, and the cathode bone frame may be a first cathode bone frame, and the cathode spine a first cathode spine that may extend parallel to the reference axis, adjacent the first anode spine and spaced by a first distance from the first anode spine in a spacing direction orthogonal to the reference axis, wherein the cathode rib may be a first cathode rib.

In a farther aspect, an orthogonal finger capacitor according to one exemplary embodiment may include a second cathode bone frame in the metal layer, having a second cathode spine that extends parallel to the reference axis, and may be adjacent to the first anode spine and spaced by a second distance from the first anode spine in a direction opposite the spacing direction, and that may have a second cathode rib.

In an aspect, the set of anode fingers may be a first set of anode fingers that extends from the first anode spine, in the spacing direction, toward the first cathode spine, and the set of cathode fingers may be a first set of cathode fingers that extends from the first cathode spine, in the direction opposite the spacing direction, toward the first anode spine. In a related aspect, the orthogonal finger capacitor can further include a second set of anode fingers that extends from the first anode spine, in the direction opposite said spacing direction, toward the second cathode spine, and a second set of cathode fingers that extends from the second cathode spine, in the spacing direction toward the first anode spine, and interdigitated with the second set of anode fingers.

Example methods according to one exemplary embodiment may include, in forming an orthogonal finger capacitor, forming in a metal layer an anode bone frame having an anode spine that extends along a longitudinal axis, and an anode rib connected to the anode spine, a set of anode fingers that may extend from one from among the anode spine and the anode rib, a cathode bone frame having a cathode spine that extends parallel to the longitudinal axis and having a cathode rib connected to the cathode spine, and a set of cathode fingers that may extend from one among the cathode spine and the cathode rib and that is interdigitated with the set of anode fingers.

In an aspect, methods according to one exemplary embodiment may further include forming an insulating dielectric on the anode bone frame, the set of anode fingers, the cathode bone frame, and the set of cathode fingers, forming an overlaying anode bone frame, in an overlaying metal layer above the insulating dielectric and the metal layer, having an overlaying anode spine and an overlaying anode rib, wherein at least a segment of the overlaying anode rib may be above and extend in alignment with the anode spine, and at least a segment of the overlaying anode spine may extend above and in alignment with the anode rib, and may include forming an anode via coupling the anode bone frame to the overlaying anode bone frame.

Example methods according to one exemplary embodiment may include, in forming an orthogonal finger capacitor, step of forming an anode bone frame having an anode spine that extends along a longitudinal axis, and an anode rib connected to the anode spine, step of forming a set of anode fingers that extends from one from among the anode spine and the anode rib, step of forming a cathode bone frame having a cathode spine that extends parallel to the longitudinal axis and having a cathode rib connected to the cathode spine, and step of forming a set of cathode fingers that extends from one among the cathode spine and the cathode rib and that is interdigitated with the set of anode fingers.

According to one exemplary embodiment, an orthogonal finger capacitor may include a set of anode fingers, a set of cathode fingers interdigitated with the set of cathode fingers, an insulating dielectric on the set of anode fingers interdigitated with the set of cathode fingers, a set of overlaying anode fingers extending above and orthogonal to the set of anode fingers, a set of overlaying cathode fingers extending above and orthogonal to the set of cathode fingers and interdigitated with the set of overlaying anode fingers, means for low resistance coupling of the set of anode fingers, through an anode via having a diameter significantly larger than a diameter of an anode finger in the set of anode fingers, to the set of overlaying anode fingers, and means for low resistance coupling of the set of cathode fingers, through a cathode via having a diameter significantly larger than a diameter of a cathode finger in the set of cathode fingers, to the set of overlaying cathode fingers.

BRIEF DESCRIPTION OF THE DRAWINGS

The accompanying drawings are presented to aid in the description of embodiments of the invention and are provided solely for illustration of the embodiments and not limitation thereof.

FIG. 8 shows a plan view of a region of another example alternative arrangement of bone frames for a bone frame IFC layer for MOM bone frame OFCs according to an embodiment.

DETAILED DESCRIPTION

Figure 1:
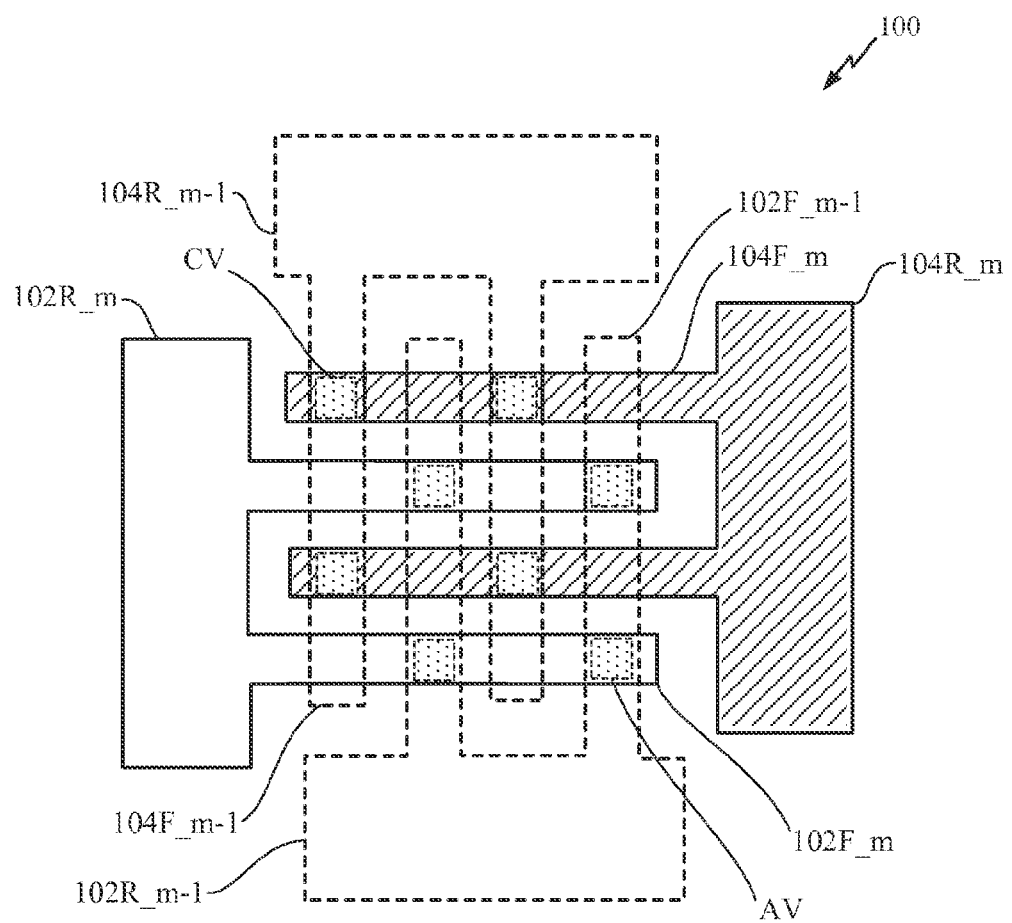
FIG. 1 shows a plan view and a hidden line projection of two overlaying layers of a related art MOM finger capacitor.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The term "embodiments of the invention" does not require that all embodiments of the invention include the discussed feature, advantage or mode of operation.

The terminology used herein is for purposes of describing examples according to particular embodiments, and is not intended to be limiting of embodiments of the invention. As used herein, the singular forms "a," "an" and "the" are intended to include the plural forms as well, unless the context clearly indicates otherwise. It will be further understood that the terms "comprises," "comprising," "includes" and/or "including", when used herein, specify the presence of stated features, integers, steps, operations, elements, and/or components, but do not preclude the presence or addition of one or more other features, integers, steps, operations, elements, components, and/or coups thereof.

Further, many embodiments are described in terms of sequences of actions to be performed, for example by elements of a computing device. Specific circuits application specific integrated, circuits (ASICs)), program instructions being executed by one or more processors, or a combination of both, may perform the various actions described herein. Additionally, the sequences of actions described herein can be considered to be embodied entirely within any form of computer readable storage medium having stored therein a corresponding set of computer instructions that upon execution would cause an associated processor to perform, or to control a fabrication facility to perform, any method described herein. Thus, the various aspects of the invention may be embodied in a number of different forms, all of which have been contemplated to be within the scope of the claimed subject matter. In addition, for each of the embodiments described, herein, the corresponding form of any such embodiments may be described herein as, for example, "logic configured to" perform the described action.

The terms "horizontal" and "vertical," when used, in description referencing one or more figures mean, except where explicitly stated otherwise or made clear from a particular context to a have different meaning, mutually perpendicular axes extending in the plane of the figure, with "vertical" being perpendicular to the bottom and the top edge of the figure. It will be appreciated, that the terms "X" and "Y" may be substituted for "horizontal" and "vertical," respectively.

The terms "up" and "upward," when used in reference to figures, mean, except where explicitly stated otherwise or where clear from a particular context to have a different meaning, a vertical direction extending from the bottom edge of the referenced figure toward the top edge.

FIG. 1 shows a plan view of a related art two-layer MOM finger capacitor 100, having a metal layer "m" with a conductor pattern shown in solid lines, overlaying a metal layer "m−1" with a conductor pattern shown in dotted lines as it is hidden by the metal layer m. An insulating oxide (or more generally, dielectric) layer (not explicitly shown) or equivalent is arranged between the metal layers "m" and "m−1." The conductor pattern in the metal layer "m" (hereinafter referred, to as the "layer m") includes an anode frame 102R_m extending along the "Y" axis (alternatively referenced, in the context of FIG. 1, as the "vertical" direction). A plurality, two, anode fingers 102F_m extend from that anode frame 102R_m in a left-to-right direction, along the "X" axis (alternatively referenced, in the context of FIG. 1, as the "horizontal" direction). The related art two-layer MOM finger capacitor 100 further includes a cathode frame 104R_m displaced in the horizontal direction from, and extending, parallel to, the anode frame 102R_m. A plurality, in this example two, cathode fingers 104F_m extend horizontally, in a right-to-left direction, having an alignment and dimensions (collectively "an arrangement") such that the cathode fingers 104F_m are interdigitated with the anode fingers 102F_m. Various conventional models are known for approximating the total capacitance of the related art two-layer MOM finger capacitor 100. One rough approximation may model the interdigitated arrangement, in each of the metal layers m and m−1, as a plurality of capacitor elements or "sub-capacitors." For example, in the metal layer in, capacitance aspects of the interdigitated anode fingers 102F_m and cathode fingers 104F_m can be roughly modeled as three, capacitor elements or "sub-capacitors."

With continuing reference to FIG. 1, the metal layer m−1 of the related art two-layer MOM finger capacitor 100 has an anode frame 102R_m−1 from which a plurality, e.g., two, anode fingers 102F_m−1 can extend. The extending direction of the anode fingers 102F_m−1 is vertically upward (as defined in the plane of FIG. 1), which is orthogonal to the left-to-right horizontal direction of the layer m anode fingers 102F_m−1. In the same m−1 layer, a cathode frame 104R_m−1 is disposed. A plurality, in this example two, cathode fingers 104F_m−1 may extend in a vertically downward direction, opposite the direction of the anode fingers 102F_m−1, with an arrangement such that the cathode fingers 104F_m−1 are interdigitated with the anode fingers 102F_m−1.

Referring still to FIG. 1 each of the layer m anode fingers 102F_m may be coupled, by a corresponding plurality of vias AV, to some or all of the set of anode fingers 102F_m−1 of the underlying metal layer m−1. In the FIG. 1 example, each of the anode fingers 102F_m is connected, by a corresponding two vias AV, to both of the underlying anode fingers 102F_m−1. Similarly, two cathode vias CV couple each of the layer m cathode fingers 104F_m to the two underlying cathode fingers 104F_m−1. One known alternative conventional technique is vias (not shown) terminate on the frames, e.g., anode frames 102R_m, 102R_m−1 and cathode frames 104R_m, 104R_m−1. However, via connection on the metal fingers, as shown by the FIG. 1 example anode vias AV and cathode vias CV, can provide better electrical connection to the metal fingers.

Figure 2:
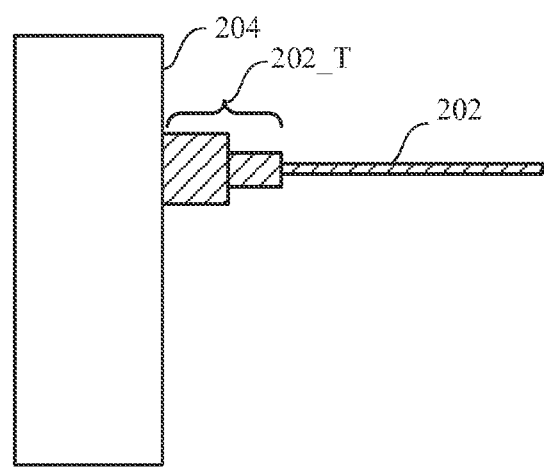
FIG. 2 shows a related art transition width at the junction of a comb finger with a corresponding frame.

Characteristics of related art two-layer MOM finger capacitors such as the example 100 can impose various costs as well as performance and design constraints. One is that the required width of the anode frame 102R_m and cathode frame 104R_m can be substantially greater than the optimal width of the extending fingers, e.g., the optimal width of the anode fingers 102F_m and cathode fingers 104F_m. This, in turn, can require forming the anode fingers 102F_m and cathode fingers 104F_m with a transition width, widening proximal to their junction with their respective anode frame and cathode frame, FIG. 2 shows a representative example of such a transition width portion 202_T at the junction of a generic finger 202 with a generic frame 204.

Another cost, which can manifest as decreased reliability and increased total real resistance of the M-layer MOM finger capacitor device, may arise due to vias AV and CV having a small cross-sectional area (i.e., area in the plane of FIG. 1). The small area of the vias AV and CV is dictated by the narrow width of the anode and cathode fingers on which they are formed. Small area vias may have, in some applications, reliability costs. For example, small vias on or under dense metal fingers may increase MOM leakage and, further, may cause TDDB (time dependent dielectric breakdown) reliability problem. The small area of vias AV and CV may contribute to increased real resistance of M-layer MOM finger capacitor device.

Figure 3:
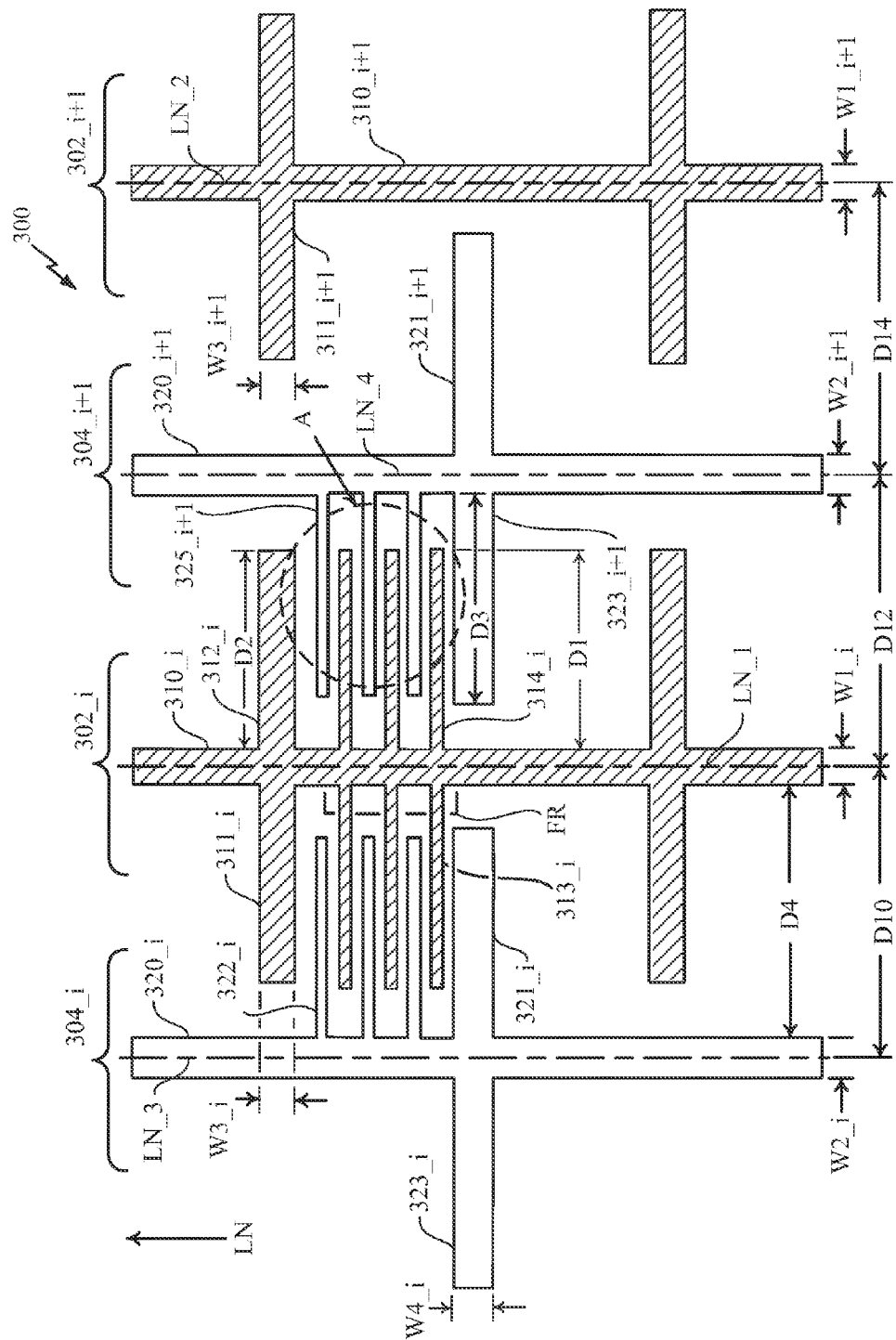
FIG. 3 shows a plan view of one example MOM bone frame interdigitated finger capacitor (IFC) layer of one example MOM bone frame orthogonal finger capacitor (OFC) according to an embodiment.

FIG. 3 shows a plan view of one example bone frame, interdigitated finger capacitor layer 300 according to an embodiment. The bone frame interdigitated finger capacitor layer 300 may be one layer, for one or more MOM bone frame orthogonal finger capacitors according to various exemplary embodiments, as described in greater detail in later sections.

For brevity, the phrase "interdigitated finger capacitor" will be alternatively referenced as "IFC," and the phrase "orthogonal finger capacitor" will be alternatively referenced as "OFC." It will be understood that "IFC" is intended only as a shortened recitation of "interdigitated finger capacitor" and, similarly, that "OFC" is intended only as a shortened recitation of "orthogonal finger capacitor," and that neither imparts any further meaning.

It will be understood that labeling in this description of certain structures as one of an "anode" structure and a "cathode" structure is arbitrary. In other words, interchanging the terms "anode" and "cathode" in the description will not change the structure that is described.

Referring to FIG. 3, the bone frame IFC layer 300 may include in a given metal layer (not entirely shown) one or more anode bone flames, such as the first and second anode bone frames 302_i and 302_i+1. Structures will be described relative to a reference axis LN that lies in the plane of the metal layer. In an aspect, the first anode bone frame 302_i may comprise a first anode spine 310_i and one or more anode rib elements, for example, the left anode rib 311_i and the right anode rib 312_i, and like structures shown but not separately numbered. The first anode spine 310_i may extend along a first longitudinal axis LN_1 that, in the FIG. 3 example, is parallel to the reference axis LN. It will be understood that the reference axis LN and longitudinal axis LN_1 are shown in FIG. 3 oriented vertically in the plane of the figure, but this is only for viewing convenience, as LN (and LN_1) can extend in any direction relative to any external reference. In an aspect, the second anode bone frame 302_i+1 may comprise a second anode spine 310_i+1 and one or more anode rib elements, for example the left anode rib 311_i+1 and like structures shown hut not separately numbered. The second anode spine 310_i+1 may extend along a longitudinal axis LN_2, also parallel to the given reference axis LN.

With continuing reference to FIG. 3, the bone frame IFC layer 300 may include a first cathode bone frame 304_i to the left (in the FIG. 3 view of the first anode bone frame 302_i, and may include a second cathode bone frame 304_i+1 to the right of the first anode bone frame 302_i. The first cathode bone frame 304_i may have a first cathode spine 320_i extending along a longitudinal axis LN_3, also parallel to the given reference axis LN. The first cathode spine 320_i may support and connect to one or more cathode rib elements, for example, the left cathode rib 323_i and right cathode rib 321_i, and like structures shown but not separately numbered. The second cathode bone frame 304_i+1 may have a second cathode spine 320_i+1 extending along a longitudinal axis LN_4, also parallel to the given reference axis LN. The second cathode spine 320_i+1 may support and connect to one or more cathode rib elements, for example, the left cathode rib 323_i+1 and right cathode rib 321_i+1, and like structures shown but not separately numbered.

For convenience in describing certain structural relationships, the first and second cathode bone frames 304_i and 304_i+1 will be alternatively referenced, relative to the first anode bone frame 302_i, as the "left neighbor" cathode bone frame 304_i, and the "right neighbor" cathode bone frame 304_i+1. Similarly, in description of certain structural relationships between the first and second cathode bone frames 304_i and 304_i+1 and the first anode bone frame 302_i, the first and second cathode bone flames 304_i and 304_i+1 will be collectively referenced, in the alternative, as "the neighboring cathode bone frames" 304.

Referring to FIG. 3 it should be noted that the longitudinal axis LN_3 of the first cathode spine 320_i of the first cathode bone frame 304_i is spaced laterally, to the left, a distance D10 from the longitudinal axis LN_1 of the first anode spine 310_i of the first anode bone frame 302_i. It will be understood that, in this context, "laterally" means a direction orthogonal to the reference axis LN, in the plane of the first anode bone frame 302_i and the first cathode bone frame 304_i. In a similar aspect, the longitudinal axis LN_4 of the second cathode spine 320_i+1 of the second cathode bone frame 304_i+1 is spaced laterally, to the right, a distance D12 from the longitudinal axis LN_1 of the first anode spine 310_i. In a further aspect, the longitudinal axis LN_2 of the second anode spine 310_i+1 of the second anode bone frame 302_i+1 is spaced laterally, to the right, a distance D14 from the longitudinal axis LN_4 of the second cathode spine 320_i+1.

According to one or more exemplary embodiments, one or both of the first and second anode bone frames 302_i and 302_i+1, may connect to and support one or more sets of anode fingers. As described in greater detail in later sections, in an aspect, for each of one or more sets of anode fingers connected to and supported by one of the first and second anode bone frames 302_i and 302_i+1, a corresponding set of cathode fingers may be connected to and supported by a neighboring cathode bone frame. In an aspect, the anode fingers and corresponding cathode fingers may be configured, and may be connected to and supported by their respective anode and cathode bone frames, to form a cooperative, interdigitated set anode and cathode fingers.

Referring to FIG. 3, one example is shown by the cooperative, interdigitated arrangement of the set of anode fingers 313_i (i.e., the set of anode fingers of which one arbitrary sample is labeled "313_i") and the set of cathode fingers 222_i (i.e., the set of cathode fingers of which one arbitrary sample is labeled "322_i"). In this example, the set of anode fingers 313_i is connected to and supported by the first anode spine 310_i of the first anode bone frame 302_i, and the set of cathode fingers 322_i is connected to and supported by the first cathode spine 310_i of the left neighbor cathode bone frame 304_i. Another example is shown by the cooperative, interdigitated arrangement of the set of anode fingers 314_i (i.e., the set of anode fingers of which one arbitrary sample is labeled "313_i") and the set of cathode fingers 325_i+1 (i.e., the set of cathode fingers of which one arbitrary sample is labeled "325_i+1"). The set of anode fingers 314_i is connected to and supported by the first anode spine 310_i, and the set of cathode fingers 325_i+1 is connected to and supported by the second cathode spine 320_i+1. The set of anode fingers 313_i and the set of anode fingers 314_i are also one example of an anode bone frame having a first set of anode fingers and a second set of anode fingers. Relative to the one example, the cathode fingers 322_i and 325_i+1 can be a corresponding first set of cathode fingers and second set of cathode fingers, respectively.

It will be understood that "support" and "supporting," in the context of any portion of an anode bone frame supporting anode fingers, of any portion of a cathode bone frame supporting cathode fingers, means in an electrical sense, e.g., the anode (or cathode) finger has a conducting juncture with the anode (or cathode) bone frame. The conducting juncture may, or may not, provide "support" in the sense of significant mechanical support.

As will be described in greater detail in later sections, embodiments of the invention are not limited to anode and cathode fingers being connected and supported by anode and cathode spines of anode and cathode none frames. On the contrary, as will also be described in greater detail, exemplary embodiments contemplate cooperative, interdigitated arrangements of anode and cathode fingers, one or both of which may be connected to and supported by a rib of a corresponding anode or cathode bone frame.

Referring to FIG. 3, the segment or region of the first anode spine 310_i from which the set of anode fingers 313_i extend is labeled "FR." In describing certain aspects, this segment or region will be referred to as the "finger section" FR of the anode spine 310_i that is associated with the anode fingers 313_i." To avoid obscuring details by excess reference numbers, FIG. 3 omits the "FR" label on other segments or regions of the first anode spine 310_i from which anode fingers extend, and on segments or regions of the neighboring cathode spines 320_i and 320_i+1 from which fingers extend. It will be understood, though, that "the finger section of the first cathode spine 320_i associated with cathode fingers 322_i" is a reference to the section of the first cathode spine 320_i from which the set of cathode fingers 322_i extend. Likewise, "the finger section of the second cathode spine 320_i+1 associated with cathode fingers 325_i+1" is a reference to the section of the second cathode spine 320_i+1 from which the cathode fingers 325_i+1 extend.

For internal consistency, the direction the set of anode fingers 313_i extends from the first anode spine 310_i toward its left neighbor cathode bone frame 304_i may be referenced as a "first direction." Likewise, the direction the anode fingers 314_i extends from the first anode spine 310_i toward its right neighbor cathode bone frame 304_i+1 may be referenced as "opposite the first direction," or a "second direction." Since, the FIG. 3 bone frame IFC layer 300 is configured with the set of anode fingers 313_i and 314_i extending from the first anode spine 310_i, which extends along LN_1 (and parallel to LN), the first and second direction are orthogonal to LN. It will be understood that the selection of "first direction" and "second direction" is arbitrary.

As will be appreciated, one or more of the cooperative, interdigitated arrangements of anode and cathode fingers shown in FIG. 3 may form an interdigitated capacitor element (shown but not separately labeled). Such an interdigitated capacitor element may form a capacitor device. For example, the above-described cooperative, interdigitated arrangement of the set of anode fingers 313_i and the set of cathode fingers 322_i may form a single-layer capacitor device. In another aspect, the cooperative, interdigitated arrangement of, for example, the set of anode fingers 313_i and the set of cathode fingers 322_i may form one multi-finger capacitor layer in a multi-layer, bone frame, orthogonal finger capacitor device (not shown in FIG. 3) in accordance with various exemplary embodiments. In a further aspect, the multi-layer capacitor may include a second anode bone frame and a second cathode bone frame formed in an overlaying metal layer (not shown in FIG. 3). In an aspect, the overlaying metal layer second anode bone frame may have a second anode spine, and a second anode rib. In one or more aspects, the overlaying metal second anode spine may be formed to have a portion above and aligned with one from among the underlying metal layer first anode spine and first anode rib. Further to these aspects, the overlaying metal layer second anode rib may be formed to have a portion above, and aligned with, the other of the underlying metal layer first anode spine and first anode rib. Examples according to these and further aspects will be described in greater detail in reference to FIGS. 6 and 7, and elsewhere later in this disclosure. In one example according one or more aspects, an anode via may be formed, extending from the underlying metal layer first anode spine to the overlaying metal later second anode rib, or from the underlying metal layer anode first anode rib to the overlaying metal layer second anode spine. In a related aspect, a cathode via may extend from the underlying metal layer first cathode spine to the overlaying metal layer second cathode rib, or extend from the underlying metal layer first cathode rib to the overlaying metal layer second cathode spine. Examples of such anode and cathode vias according to these and further aspects will be described in greater detail in reference to FIGS. 6 and 7, and elsewhere later in this disclosure.

Referring to FIG. 3, it will be understood that the example quantity of fingers in the set of anode fingers 313_i and the cooperating set of cathode fingers 322_i, i.e., three, is only one example quantity and is not intended as any limitation on the embodiments. Persons of ordinary skill in the art having view of this disclosure will understand that the quantity of fingers in any of the cooperative, interdigitated arrangements of anode and cathode fingers can be application specific. Such persons will also understand that quantities of fingers forming any of the cooperative, interdigitated arrangements within the scope of the exemplary embodiments can be readily determined by applying conventional design techniques to the present disclosure, without undue experimentation. In addition, the set of anode fingers 313_i and the set of anode fingers 314_i are shown having the same number of fingers, i.e., three. However, three fingers is only one example quantity, and is not intended to limit the scope of any exemplary embodiments. For example, the quantity of fingers within the set of anode fingers 313_i (and its cooperating set of cathode fingers 322_i) may be less than, or greater than, the quantity of fingers within the set of anode fingers 314_i and its cooperating set of cathode fingers 325_i+1.

It will be understood that the first anode bone frame 302_i having both a right neighbor cathode bone frame 304_i+1 and a left neighbor cathode bone frame 304_i is only an example. As will be appreciated, alternative configurations (not shown in FIG. 3) in accordance with exemplary embodiments may include anode bone frames structured such as the first anode bone frame 302_i, but having only one of a left and right cathode bone frame. For example, one alternative configuration (not shown in FIG. 3) may omit the first direction set of anode fingers 313_i and the corresponding set of cathode fingers 322_i.

Referring again to FIG. 3, in an aspect, the first anode spine 310_i may have a width W1_i, and the second anode spine 310_i+1 may have a width W1_i+1. W1_i and W1_i+1 may be, but are not necessarily, equal. Likewise, the first and second cathode spines 320_i and 320_i+1 may have respective widths (hereinafter "spine width") W2_i and W2_i+1, and these may be, but are not necessarily, equal. The spine widths W1_i, W2_i, W1_i+1 and W2_i+1 will be generically referenced as "spine widths." in an aspect, spine widths W1_i, W1_i+1, W2_i and W2_i+1, may be equal. In another aspect, spine widths W1_i, W1_i+1, W2_i, and W2_i+1 may differ from one another. In a further aspect, the anode rib elements, e.g., anode ribs 311_i and 312_i of the first anode bone frame 302_i may have respective widths. For example, anode rib 311_i may have a width W3_i, and anode rib 312_i may have a width (shown, but not separately labeled) the same as, or different from the width W3_i. Similarly, anode rib 311_i+1 of the second anode bone frame 302_i+1 may have a width W3_i+1 that may be the same as, or different from the width (shown but not separately labeled) of anode rib 312_i+1 and/or the widths W3_i and W3_i+1.

Referring to FIG. 3, the cathode ribs may have respective widths, for example, the cathode rib 323_i of the left neighbor cathode bone frame 304_i may have width W4_i, and the cathode rib 321_i may have a width (shown, but not separately labeled) the same as, or different from the width W4_i. The cathode ribs of the right neighbor cathode bone frame 304_i+1 may have respective widths (shown, but not separately labeled) that may be the same or different from W4_i, and/or the same or different relative to one another. Specific values of the spine widths and rib widths may be application-specific. However, persons of ordinary skill in the art can readily determine the spine widths and rib widths for a given application by applying conventional engineering techniques to the present disclosure. Further detailed description is therefore omitted.

In an aspect, the anode fingers and cathode fingers have a width and a length. For example, referring to the FIG. 4 enlarged view of the FIG. 3 area "A," the anode fingers 314_i have a width, or "finger width" shown as "WF." In an aspect, "WF" can be representative of the width of all of the anode and cathode fingers depicted in FIG. 3. In another aspect, one or more cooperating, interdigitated sets of anode and cathode fingers may have a first width, e.g., WF, and another one more cooperating, interdigitated sets of anode and cathode fingers 322_i may have a second width different from the first width. The cathode fingers have a spacing "FS" and, in an aspect the anode fingers may be assumed to have the same spacing.

In a further aspect, one or more embodiments may include setting, for any set of anode fingers or cathode fingers, the ratio of the finger width to the width of its corresponding spine, e.g., WF/W1_i, within a limit, as described in greater detail in later sections. Among various benefits, this aspect may reduce or eliminate need for a transition width at the base of the fingers, e.g., the transition width portion 202_T shown in the related art FIG. 2.

In an aspect, each of the anode and cathode fingers has a corresponding finger length, for example, the "D1" length may be the length of all anode fingers in the set of anode fingers 314_i. In one aspect, "D1" can be representative of the length of all anode and cathode fingers depicted in FIG. 3. In another aspect, anode and cathode fingers forming one interdigitated set of anode and cathode fingers may have a first length, while anode and cathode fingers forming another interdigitated set of anode and cathode fingers may have a second, different length. In one aspect, for any interdigitated set of anode and cathode fingers, the distal ends of the anode fingers may be close to, but preferably not touch the cathode spine from which the cathode fingers extend, and vice versa. For example, the length of the set of cathode fingers 325_i+1 may be approximately the same as the length of the corresponding set of anode fingers 314_i, i.e., D1. Specific values of the finger lengths may be application-specific. However, for a given application, persons of ordinary skill in the art can readily determine one or more finger lengths by applying conventional engineering techniques to the present disclosure. Further detailed description is therefore omitted.

Referring to FIG. 3, in aspects providing an anode bone frame having an anode spine supporting and connecting to anode fingers, and one or more anode ribs extending orthogonal to the spine, one further aspect may include a spacing of one of the cathode cooperating, interdigitated fingers with respect to one of the anode ribs. For example, referring to FIGS. 3 and 4, right anode rib 312_i extends alongside the topmost (in the viewing plane of FIGS. 3 and 4) cathode finger in the set of cathode fingers 325_i+1. For convenience, the topmost cathode finger in the set of cathode fingers 325_i+1 may be referenced, in relation to the right anode rib 312_i, as "the proximal cathode finger" 325_i+1. According to an aspect, the right anode rib 312_i may be spaced distance D6 from the proximal cathode finger 325_i+1. The distance D6 may be equal, or approximately equal to the finger-to-finger gap D5.

Likewise, in aspects providing a cathode bone frame having a cathode spine supporting and connecting to cathode fingers, and one or more cathode ribs extending orthogonal to the spine, one further aspect may include a spacing of one of the anode cooperating, interdigitated fingers with respect to one of the cathode ribs. As an example, referring to FIGS. 3 and 4, the left cathode rib 323_i+1 extends alongside the bottommost (in the viewing plane of FIGS. 3 and 4) anode finger in the set of anode fingers 314_i, i.e., "the proximal anode finger" 314_i. According to an aspect, the left cathode rib 323_i+1 may be spaced distance D7 from the proximal anode finger 314_i. The distance D7 may be equal, or approximately equal to the distance D6.

Regarding lengths of anode ribs and cathode ribs of anode and cathode bone frames according to exemplary embodiments, in an aspect these lengths may be the same, or approximately the same as the length of corresponding fingers. For example, referring to FIG. 3, in an aspect, the right anode rib 312_i may extend from the first anode spine 310_i a distance D2 that may be equal, or approximately equal the finger length D1 of the set of anode fingers 314_i. Similarly, left cathode rib 323_i+1 may extend from the second cathode spine 320_i+1 a distance D3 that may be equal, or approximately equal the finger length (shown but not separately labeled) of the set of cathode fingers 325_i+1.

Figure 5:
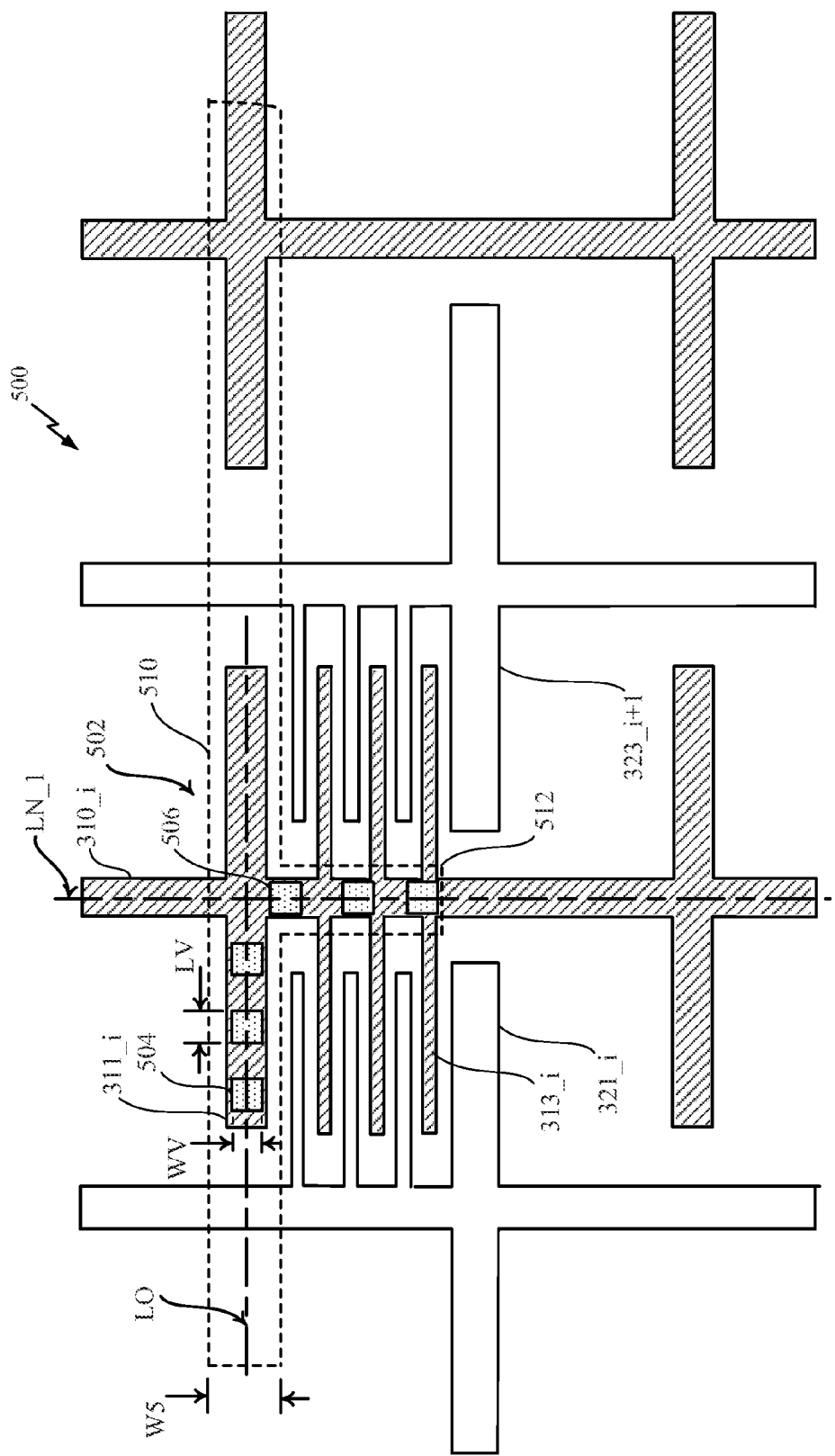
FIG. 5 shows a projection view of the FIG. 3 example MOM bone frame IFC layer, with a superposed dotted line plan view of a via-coupled region of one example MOM orthogonal bone frame in an overlaying metal layer, according to one embodiment.

FIG. 5 shows a projection view of a MOM bone frame OFC section 500. The MOM bone frame OFC section 500 may be a portion of a MOM bone frame OFC device (not shown in its entirety by FIG. 5) in accordance with one or more exemplary embodiments. The MOM bone frame OFC section 500 may comprise a portion of the FIG. 3 example bone frame IFC layer 300, with an overlaying anode bone frame 502, shown by superposed dotted line plan view. The overlaying anode bone frame 502 may be formed in an overlaying metal layer (not otherwise shown). For clarity of reference, the overlaying anode bone frame 502 will be alternatively referred to as the "overlaying metal layer" or "OVL" anode bone frame 502. According to the orthogonal alignment, the OVL anode bone frame 502 includes an OVL anode spine 510 that extends orthogonal to the LN reference axis of the FIG. 3 layer anode spines 310 and cathode spines 320, and an OVL anode rib 512 that extends parallel to LN. For clarity in referencing orientation relative to the FIG. 3 LN axis, the FIG. 5 OVL anode bone frame 502 will be referred to as the "orthogonal OVL anode bone frame" 502. For similar reasons, the OVL anode spine 510 and MIL anode rib 512 will be referred to as the "orthogonal OVL anode spine" 510 and the "orthogonal OVL anode rib" 512, respectively.

As described in greater detail at later sections, the orthogonal orientation of the FIG. 5 OVL anode bone frame 502 relative to the LN axis of the underlying anode spines 310 and cathode spines 320 is only an example, and is not intended to limit the scope of any of the embodiments.

Referring to FIG. 5, in an aspect, at least a section or segment of the orthogonal OVL anode spine 510 may extend along a longitudinal axis LO of the underlying anode rib 311_i. In an aspect, LO is orthogonal to LN. In one aspect, one or more vias 504 couple the orthogonal OVL anode spine 510 to the anode rib 311_i, with the vias 504 being located in a region where the orthogonal OVL anode spine 510 is aligned with and overlays the anode rib 311_i. Location of the vias 504 according to this aspect provides a via length LV and width WV substantially larger than the corresponding dimensions of the FIG. 1 conventional vias AV. A reason is that the respective widths W5 and W3_i of the mutually aligned orthogonal OVL anode spine 510 and anode rib 311_i where the vias 504 are located are substantially greater than the width of the anode fingers 102F_m to which the conventional vias AV couple. The area of the vias 504 may therefore be substantially larger than the area of the conventional vias AV. The larger area of the vias 504 may provide a correspondingly lower resistance than provided by the related art FIG. 1 vias AV. It will also be appreciated that embodiments may stack replicas of the structures and arrangements shown in FIG. 5, and that the resistance provided by larger vias 504 may provide further benefits in such structures and arrangements.

Continuing to refer to FIG. 5, it will be noted that the width W5 of the segment of the orthogonal OVL anode spine 510 aligned with and overlaying the anode rib 311_i is drawn to appear wider than the width W3_i (labeled on FIG. 3, not on FIG. 5) of the underlying anode rib 311_i. It will be understood, though, that the difference in size between the FIG. 5 graphical representations labeled W5 and W3_i is not intended as any limitation on the actual relation of W5 and W3_i. The FIG. 5 example, instead, shows W5 as apparently larger than W3_i to allow, in the FIG. 5 projection plane, concurrent visibility of the anode rib 311_i and the overlaying segment of the orthogonal OVL anode spine 510. It will be understood that the width W5 may be, in an aspect, the same or approximately the same as the width W3_i of the underlying anode rib 311_i.

It will be understood that the depicted quantity, arrangement, and geometry of the vias 504 are only examples, and are not intended to limit the scope of via structures for practicing according to the embodiments. Various embodiments are described in greater detail, for example in reference to FIGS. 9 and 10, exemplary embodiments contemplate other quantities, arrangements, and geometries of vias connecting overlaying bone frame structures.

In an aspect, at least a region or segment (shown but not separately numbered) of the orthogonal OVL anode rib 512 may extend above and in alignment with the longitudinal axis LN_1 of the underlying first anode spine 310_i. Further to this aspect, the region or segment of the orthogonal OVL anode rib 512 above and in alignment with the longitudinal axis LN_1 may include the anode finger 313_i section of the first anode spine 310_i. In a related aspect, one or more vias 506 may couple the orthogonal OVL anode rib 512 to the anode finger 313_i section of the first anode spine 310_i. It will be appreciated that the location of the vias 506 relative to the anode fingers 313_i may provide a low resistance, geometrically short electrical path from the vias 506 to the anode fingers 313_i. The low resistance, short electrical path from the vias 506 to the anode fingers 313_i can be comparable to a direct coupling as provided by the FIG. 1 conventional vias AV, but with substantially larger area vias 506.

With continuing reference to FIG. 5, it will be understood that the orthogonal OVL anode spine 510 may support and connect to a set of anode orthogonal fingers (not shown in FIG. 5) that extend above the anode fingers 313_i, but in an orthogonal direction. Likewise, an orthogonal OVL cathode bone frame (not shown in FIG. 5) may be arranged adjacent to the orthogonal OVL anode bone frame 502, and may support a set of cathode orthogonal fingers (not shown in FIG. 5) in a cooperative, interdigitated arrangement with the above-described, anode orthogonal fingers connected to and supported by the orthogonal OVL anode spine 510. The cooperative, interdigitated arrangement of the overlaying anode and cathode orthogonal fingers may be identical (or approximately identical to the cooperative, interdigitated arrangement of the set of anode finger 313_i and set of cathode finger 322_i, except for having an orthogonal orientation. As will be understood by persons of ordinary skill in the art from this disclosure, an insulating dielectric layer (not shown in FIG. 5), for example a metal oxide, may be interposed between the described layers.

Referring to FIG. 5, as previously described herein, an orthogonal OVL cathode bone frame may be arranged adjacent to the orthogonal OVL anode bone frame 502. In an aspect, an orthogonal OVL cathode bone frame arranged as such may have an orthogonal OVL cathode rib having a segment or region above and aligned with the cathode finger 325_i+1 section of the cathode spine 320_i. In a further aspect, one or more vias (not shown in FIG. 5) similar to vias 506 may extend through the dielectric layer and couple such a segment or region of an orthogonal OVL cathode rib, arranged as such, to the cathode finger 325_i+1 section of the cathode spine 320_i. In a similar aspect, an orthogonal OVL cathode bone frame arranged as such may have an orthogonal OVL cathode spine having a segment or region above and aligned with the cathode rib 321_i of the first cathode bone frame 304_i and/or the cathode rib 323_i+1 of the second cathode bone frame 304_i+1. In a further aspect, one or more vias (not shown in FIG. 5) similar to vias 504 may extend through the dielectric layer and couple such a segment or region of an orthogonal OVL cathode spine, arranged as such, to the cathode rib 321_i and/or to the cathode rib 323_i+1.

Figure 4:
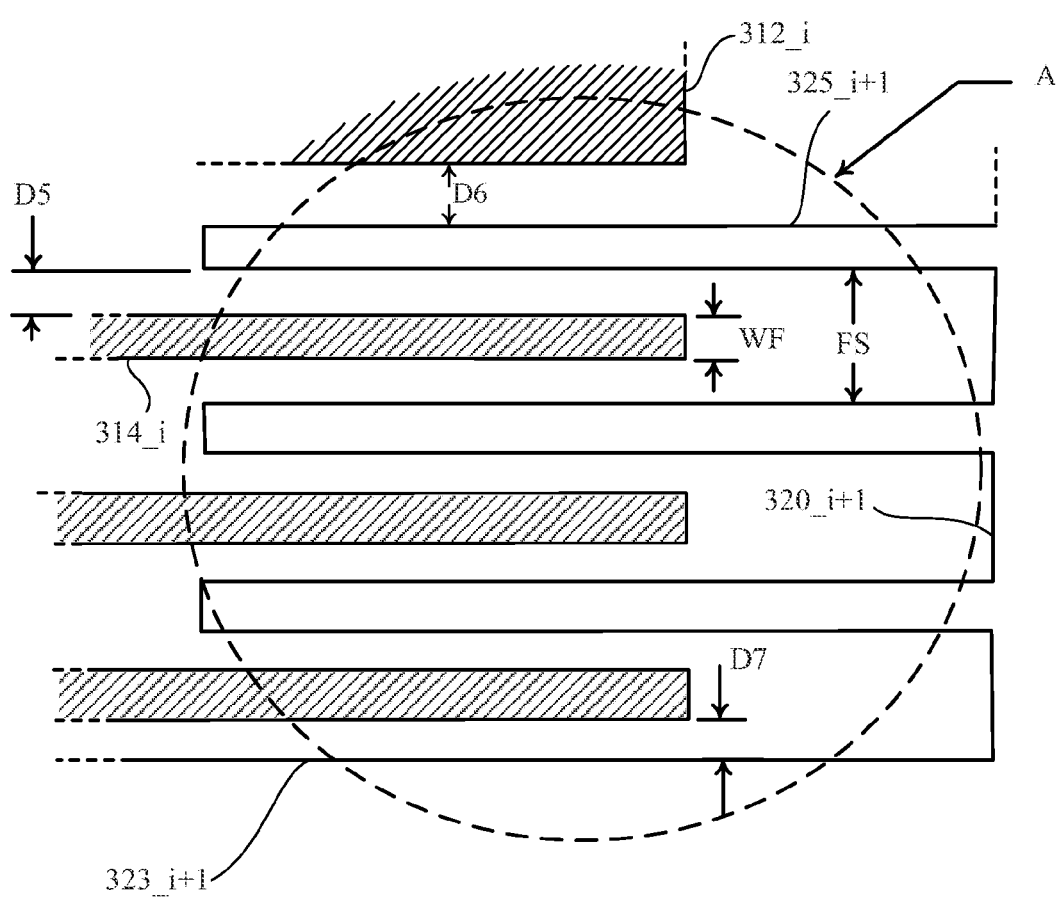
FIG. 4 is an enlarged view of the FIG. 3 example area "A."
Figure 6:
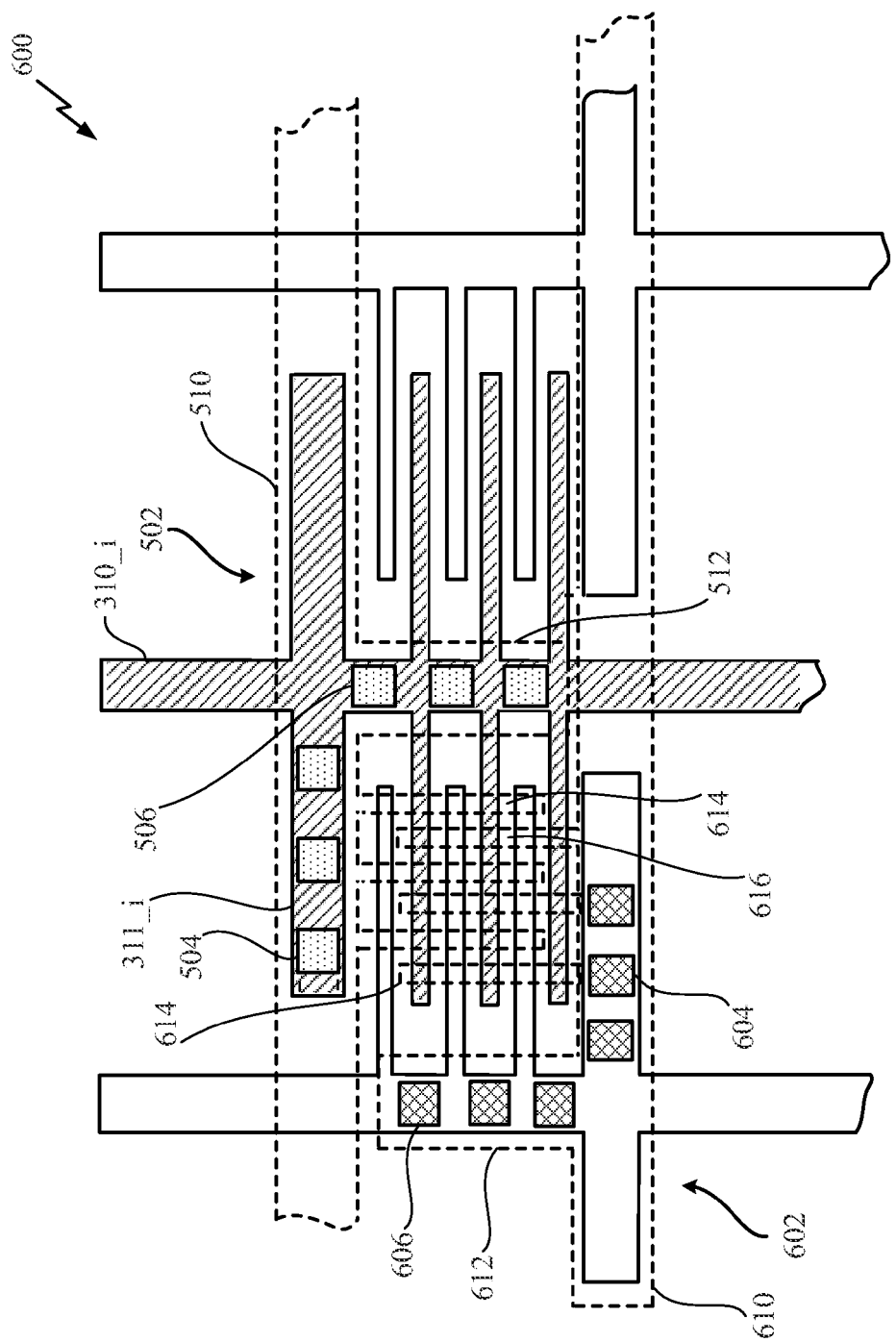
FIG. 6 shows the FIG. 5 example with a cathode bone frame and interdigitated fingers in the overlaying metal layer, and inter-layer cathode vias, according to an embodiment.

FIG. 6 shows a projection view of a MOM bone frame OFC section 600, comprising structure described in reference to FIGS. 3-5 in a further arrangement with structure including an OVL cathode bone frame 602 arranged adjacent to the orthogonal OVL anode bone frame 502. The OVL cathode bone frame 602 may be, but is not necessarily, structured similar to the orthogonal OVL anode bone frame 502. For example, the OVL cathode bone frame 602 may include an OVL cathode spine 610 and an OVL cathode rib 612. According to an aspect, the OVL cathode bone frame 602, like the orthogonal OVL anode bone frame 502, can be in an orthogonal alignment with the first cathode bone frame 304_i. In accordance with this orthogonal alignment, the OVL cathode spine 610 can extend orthogonal to the LN_3 axis (i.e., orthogonal to the reference axis LN) of the first cathode spine 320_i of the underlying first cathode bone frame 304_i. In further accordance with this orthogonal alignment, and the OVL cathode rib 612 can extend above and in alignment with LN_3. For convenience in referencing the orientation of the OVL cathode bone frame 602 relative to the LN reference axis of the underlying layer, the OVL cathode bone frame 602 will be referred to as the "orthogonal OVL cathode bone frame" 602. Similarly, the OVL cathode spine 610 and OVL cathode rib 612 will be referred to as the "orthogonal OVL cathode spine" 610 and the "orthogonal OVL cathode rib" 612, respectively.

Referring to FIG. 6, in an aspect, the orthogonal OVL anode spine 510 may support a set of orthogonal anode fingers 614. In a related aspect, the orthogonal MIL cathode spine 610 may support a set of orthogonal cathode fingers 616 in an interdigitated arrangement with the orthogonal anode fingers 614. In an aspect a quantity, for example three, vias 606 may couple a region or segment of the orthogonal OVL cathode rib 612 to a section of the cathode spine 320_i supporting the set of cathode fingers 322_i. In a similar aspect, one or more vias 604 may couple a section (shown but not separately labeled) of the orthogonal OVL cathode spine 610 supporting the orthogonal cathode fingers 616 to a section of the underlying cathode rib 321_i.

It will be understood that the FIG. 6 orthogonal orientation of the anode and cathode bone frames in successive layers is only one example of the various orientations contemplated by the invention. For example, one alternative embodiment provides a "parallel overlay" with respect to the longitudinal axes of the anode and cathode spines in successive layers. Examples according to one parallel overlay embodiment may comprise a given IFC layer, having anode and cathode bone frames oriented parallel to, for example, the FIG. 3 "LN" axis, with an overlaying layer (not shown in FIG. 6) having anode and cathode bone frames (not shown in FIG. 6) also oriented parallel to the same "LN" axis, instead of orthogonal. Various examples according to one such parallel overlay embodiment are described in greater detail in reference to FIGS. 7A-7C. As will be understood, one aspect of an exemplary parallel overlay embodiment is providing orthogonal fingers by configuring sets of interdigitated anode and cathode fingers to be supported, in one given layer, by the spines of their respective anode and cathode bone frames while being supported, in an overlaying layer, by ribs of their respective anode and cathode bone frames. This provides orthogonal overlaying interdigitated fingers because ribs and spines of the anode and cathode bone frames, according various exemplary embodiments, are orthogonal.

Figure 7A:
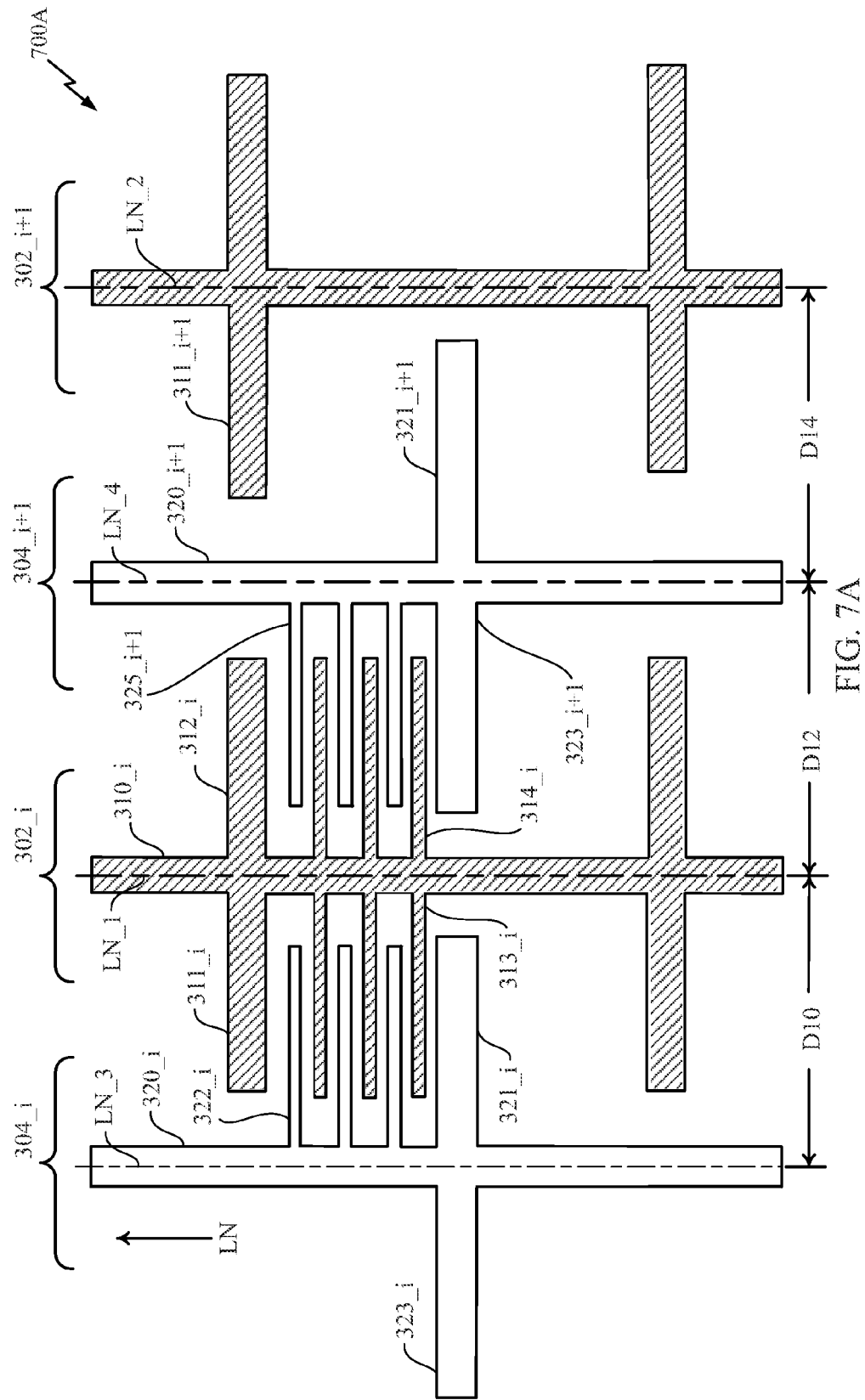
FIG. 7A shows a plan view of one example MOM bone frame IFC layer of one MOM bone frame OFC according to one alternative embodiment.
Figure 7B:
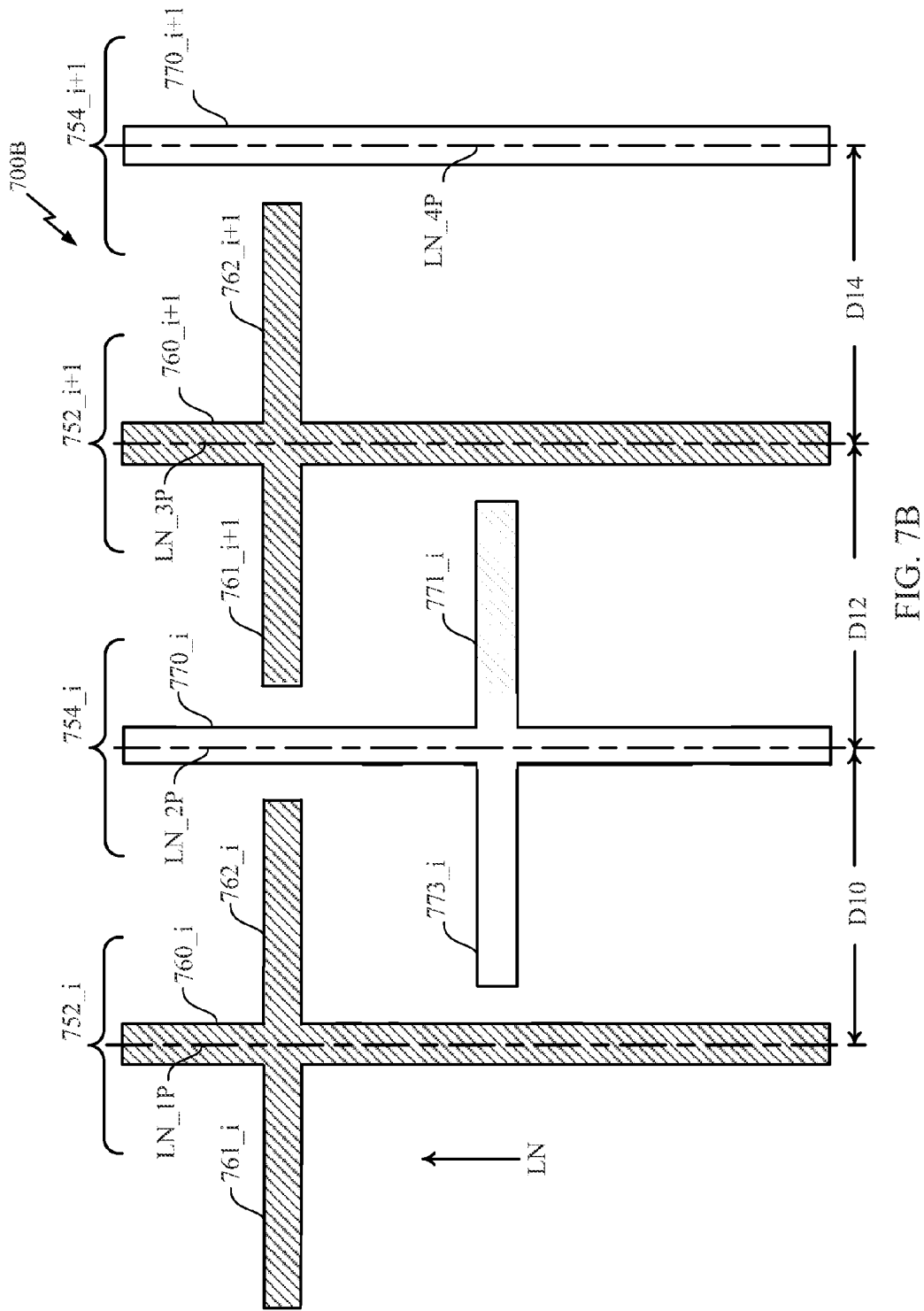
FIG. 7B shows a plan view of one example MOM bone frame IFC layer that may overlay the FIG. 7A example MOM bone frame IFC layer in one example MOM bone frame OFC according to the alternative embodiment.
Figure 7C:
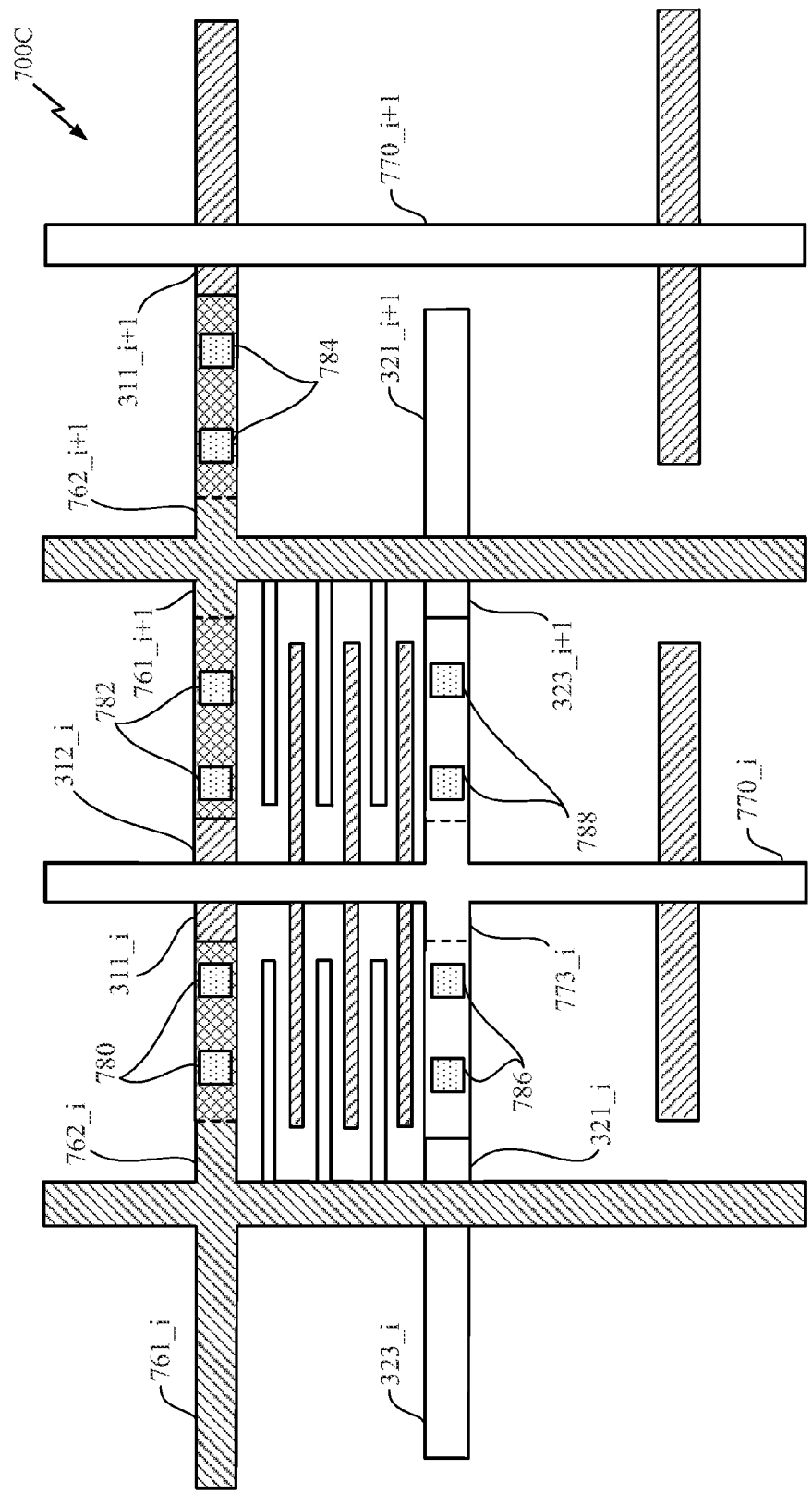
FIG. 7C shows a projection view of one example two-layer portion of example MOM bone frame IFC layer, with a superposed dotted line plan view of a via-coupled region of one example MOM orthogonal bone frame in an overlaying metal layer, according to an embodiment

FIG. 7A shows a plan view of a given bone frame IFC layer 700A that may be one layer of a multi-layer, parallel overlay, bone frame OFC device in accordance with one or more exemplary embodiments. The example configuration of the given bone frame IFC layer 700A was selected to be substantially the same as the FIG. 3 bone frame IFC layer 300. This example configuration of the bone frame IFC layer 700A is not intended to limit the scope of embodiments of the invention. On the contrary, the example bone frame IFC layer 700A was selected as substantially the same as the FIG. 3 bone frame IFC layer 300 to avoid introducing unnecessary details not integral to the concepts. Persons of ordinary skill in the art will, however, appreciate from this disclosure that the multi-layer, parallel overlay, bone frame OFC devices according to one or more embodiments may employ anode and cathode bone frames different from the FIG. 7A bone frame IFC layer 700A. FIG. 7B shows a plan view of one example overlaying bone frame IFC layer 700B formed and structured in accordance with one example parallel overlay embodiment. FIG. 7C shows a projection view of one bone frame OFC device 700C in accordance with one or more exemplary parallel overlay embodiments, comprising the FIG. 7B overlaying bone frame IFC layer 700B formed on or above the FIG. 7A bone frame IFC layer 700A.

Referring to FIG. 7A, as previously stated, the example bone frame IFC layer 700A for forming a bone frame OFC device in accordance with an exemplary parallel overlay embodiment is configured the same as the FIG. 3 bone frame IFC layer 300. For convenience, like structures are labeled the same as FIG. 3. The FIG. 7A bone frame IFC layer 700A therefore comprises, as previously described, first and second anode bone frames 302_i and 302_i+1, and first and second cathode bone frames 304_i and 304_i+1. The first anode bone frame 302_i comprises a first anode spine 310_i extending along the longitudinal axis LN_1, and the first cathode bone frame 304_i comprises a first cathode spine 320_i extending along the longitudinal axis LN_3, spaced laterally to the left of LN_1 by a distance D10. The second cathode bone frame 304_i+1 comprises a second cathode spine 320_i+1 extending along the longitudinal axis LN_4, spaced laterally to the right of LN_1 by a distance D12. The second anode bone frame 302_i+1 comprises a second anode spine 320_i+1 extending along the longitudinal axis LN_2, spaced laterally to the right of LN_3 by a distance D14. The first anode bone frame 302_i further comprises anode ribs, such the example left anode rib 311_i, the example, right anode rib 312_i, and similar structures shown but not labeled. The first cathode bone frame 304_i further comprises cathode ribs, such the example left cathode rib 323_i, the example right cathode rib 321_i, and similar structures shown but not labeled. The second cathode bone frame 304_i+1 farther comprises cathode ribs, such the example left cathode rib 323_i+1, the example right cathode rib 321_i+1, and similar structures shown but not labeled. The second anode bone frame 302_i+1 further comprises cathode ribs, such the example left anode rib 311_i+1 and similar structures shown but not labeled.

With continuing reference to FIG. 7A, as previously described, according to one or more exemplary embodiments, the first anode spine 310_i of the first anode bone frame 302_i may support a set of anode fingers 313_i, extending orthogonal to LN_1. The anode fingers 313_i may be configured and supported to have a cooperative, interdigitated arrangement with the set of cathode fingers 322_i connected to and supported by the first (or left neighbor) cathode bone frame 304_i. The cooperative, interdigitated arrangement of the set anode fingers 313_i and the set of cathode fingers 322_i may form one layer of a multi-layer OFC capacitor (not shown in FIG. 7A). Similarly, the first anode bone frame 302_i may support the set of anode fingers 314_i, also extending orthogonal to LN_1 but opposite to the set of anode fingers 313_i. The anode fingers 314_i may be configured and supported in a cooperative, interdigitated arrangement with cathode fingers 325_i+1 connected to and supported by the second (or right neighbor) cathode bone frame 304_i+1. The cooperative, interdigitated arrangement of the set of anode fingers 314_i and the set of cathode fingers 325_i+1 may form one layer of what may be another multi-layer OFC capacitor (not shown in FIG. 7A).

Referring to FIG. 7B, the example overlaying bone frame IFC layer 700B may include, for example in a left-to-right order, a first parallel OVL anode bone frame 752_i, a first parallel OVL cathode bone frame 754_i, a second parallel OVL anode bone frame 752_i+1, and a second parallel OVL cathode bone frame 754_i+1. The first parallel OVL anode bone frame 752_i may include a first parallel OVL anode spine 760_i, extending along a longitudinal axis LN_1P, connected to and supporting a "left" OVL anode rib 761_i and a "right" OVL anode rib 762_i. In an aspect, the longitudinal axis LN_1P and other described portions of the first parallel OVL anode bone frame 752_i may be configured to provide a particular alignment with the underlying first cathode bone frame 304_i and first anode bone frame 302_i. In one example, the alignment may be as follows: when the longitudinal axis LN_1P of the first parallel OVL anode spine 760_i is aligned with the axis LN_3 of the first cathode spine 320_i, a portion of the right OVL anode rib 762_i is aligned with a portion of the left anode rib 311_i of the first anode bone frame 302_i. Vias (not shown in FIG. 7B) may be formed in the region where the right OVL anode rib 762_i overlays the FIG. 3 left anode rib 311_i of the first anode bone frame 302_i. Examples will be later described in greater detail. In the FIG. 7A-7C example, operation of the left OVL anode rib 761_i is not described, because such operation would, in an aspect, relate to an anode bone frame (not shown) to the left of the FIG. 7A first cathode bone frame 304_i.

Continuing to refer to FIG. 7B, the first parallel OVL cathode bone frame 754_i may include a first parallel OVL cathode spine 770_i, extending along a longitudinal axis LN_2P, connected to and supporting a "left" OVL cathode rib 773_i and a "right" OVL cathode rib 771_i. In an aspect, the longitudinal axis LN_2P and other described portions of the first parallel OVL cathode bone frame 754_i may be configured to provide a particular alignment with the underlying first anode bone frame 302_i, first cathode bone frame 304_i and the second cathode bone frame 304_i+1. One example of the alignment may be as follows: when axis LN_P2 of the first parallel OVL cathode spine 770_i is aligned with the axis LN_1 of the first anode spine 310_i, the left MIL cathode rib 773_i is aligned with a length of the right cathode rib 321_i of the first cathode bone frame 304_i, and the right OVL cathode rib 771_i is aligned with a length of the left cathode rib 323_i of the second cathode bone frame 304_i+1. As will be later described in greater detail, vias (not shown in FIG. 7B) may be formed in the region where the left OVL cathode rib 773_i overlays the right cathode rib 321_i of the first cathode bone frame 304_i, and vias (not shown in FIG. 7B) may be formed in the region where the right OVL cathode rib 771_i overlays the left cathode rib 323_i+1 of the second cathode bone frame 304_i+1.

Related to the above-described alignment aspects of the first parallel OVL cathode bone frame 754_i, the axis LN_1P and LN_2P may be spaced apart by the same D10 distance by which the FIG. 7A axes LN_1 and LN_3 are spaced, and the axis LN_2P and LN_3P may be spaced apart by the same D12 distance by which the FIG. 7A axes LN_1 and LN_4 are spaced.

Referring to FIG. 7B, the second parallel MIL anode bone frame 752_i+1 may include a second parallel OVL anode spine 760_i+1, extending along a longitudinal axis LN_3P, connected to and supporting a "left" OVL anode rib 761_i+1 and a "right" OVL anode rib 762_i+1.

In an aspect, the longitudinal axis LN_3P and other described portions of the second parallel OVL anode bone frame 752_i+1 may be configured to provide a particular alignment with the underlying FIG. 3 second cathode bone frame 304_i+1, the first anode bone frame 302_i, and the second anode bone frame 302_i+1. In one example, the alignment may be as follows: when the longitudinal axis LN_3P of the second parallel OVL anode spine 760_i+1 is aligned with the axis LN_4 of the underlying FIG. 3 second cathode spine 320_i+1, a portion of the left OVL anode rib 761_i+1 is aligned with a portion of the right anode rib 312_i of the first anode bone frame 302_i, and a portion of the right OVL anode rib 762_i+1 is aligned with a portion of the left anode rib 311_i+1 of the second anode bone frame 302_i+1. As will be later described in greater detail, vias (not show)) in FIG. 7B) may be formed in the region where the left OVL anode rib 761_i+1 overlays the right anode rib 312_i of the first anode bone frame 302_i, and vias (not shown in FIG. 7B) may be formed in the region where the right OVL anode rib 762_i+1 overlays the left anode rib 311_i of the first anode bone frame 302_i.

Related to the above-described alignment aspects of the first parallel OVL anode bode frame 752_1, first parallel OVL cathode bone frame 754_1, second parallel OVL anode bone frame 752_i+1 and second parallel OVL cathode bone frame 754_i+1, the axis LN_2P and LN_3P may be spaced apart by the same D12 distance by which the FIG. 7A axes LN_4 and LN_1 are spaced, and the axis LN_3P and LN_4P may be spaced apart by the same D14 distance by which the FIG. 7A axes LN_4 and LN_2 are spaced.

With continuing reference to FIG. 7B, the example second parallel OVL cathode bone frame 754_i+1 includes a second parallel OVL cathode spine 770_i+1 without ribs. The second parallel OVL cathode bone frame 754_i+1 may be configured to have ribs (not shown in FIG. 7B). As can be understood by a person of ordinary skill in the art having view of this disclosure, such ribs may be configured to align with ribs of additional underlying cathode bone frames (not explicitly shown in FIGS. 7A-7C) in a manner such as described for the first parallel OVL cathode bone frame 754_i.

FIG. 7C shows a projection view of one bone frame OFC device 700C in accordance with one or more exemplary parallel overlay embodiments, comprising the FIG. 7B overlaying bone frame IFC layer 700B formed on or above the FIG. 7A bone frame IFC layer 700A. Vias 780 may couple the right OVL anode rib 762_i of the first parallel OVL anode bone frame 752_i and the left anode rib 311_i of the first anode bone frame 302_i. The vias 780 may be located in the region, provided by the above-described alignment aspects, where the right OVL anode rib 762_i overlays the left anode rib 311_i. Vias 782 may couple the left OVL anode rib 761_i+1 of the second parallel OVL anode bone frame 752_i+1 and the right anode rib 312_i of the first anode bone frame 302_i. The vias 782 may be located in the region, also provided by the above-described alignment aspects, where the left OVL anode rib 761_i+1 overlays the right anode rib 312_i. Vias 784 may couple the right OVL anode rib 762_i+1 of the second parallel OVL anode bone frame 752_i+1 and the left anode rib 311_i of the second anode bone frame 302_i+1. The vias 784 may be located in the region, provided by the above-described alignment aspects, where the right OVL anode rib 762_i+1 overlays the left anode rib 311_i+1.

Continuing to refer to FIG. 7C, vias 786 may couple the left OVL cathode rib 773_i of the first parallel OVL cathode bone frame 754_i and the right cathode rib 321_i of the first cathode bone frame 304_i. The vias 786 may be located in the region, provided by the above-described alignment aspects, where the left OVL cathode rib 773_i overlays the right cathode rib 321_i. Vias 788 may couple the right OVL cathode rib 771_i+1 of the first parallel OVL cathode bone frame 754_i to the FIG. 3 left cathode rib 323_i+1 of the second cathode bone frame 304_i+1. The vias 788 may be located in the region, provided by the above-described alignment aspects, where the right OVL cathode rib 771_i+1 overlays the FIG. 3 left cathode rib 323_i+1.

Among other features and benefits that may be provided by bone frame OFC devices such as 700C are a good connection of horizontal (anode) bones/ribs on one layer by (anode) bones/ribs of the neighboring (in a depth direction) layer, in turn providing internal connection of anode bones/ribs/fingers are connected together internally in the MOM device. Other features and benefits that may be provided by bone frame OFC devices such as 700C may be an increase in MOM capacitor density, at least in some applications, by overlapping of one layer anode bone and the other layer cathode bone.

FIG. 8 shows a plan view of a region of a bone frame IFC layer 800 having one example alternative configuration according to one exemplary embodiment. Referring to FIG. 8, in an aspect, the bone frame IFC layer 800 may comprise one or more cathode bone frames, such as the example cathode bone frame 802, which are marked by cross-hatch. The cathode bone frames may have a cathode spine such as the example labeled "804," and from which one or more cathode ribs extend, such as the example labeled "806." Adjacent to each cathode bone frame may be one or two, i.e., one on either side, anode bone frames, such as the example labeled "810." The anode bone frames may have an anode spine such as the example labeled "812," and from which one or more anode ribs extend, such as the example labeled "814." In an aspect the anode ribs, such as shown by the example anode rib 814, may all extend in the same direction. In a similar aspect, the cathode ribs, such as shown by the example cathode rib 806, may all extend in the same direction, and this may be the same as the extending direction of the anode ribs. Example arrangements of anode and cathode fingers that may be used with, or combined with structure as shown by the FIG. 8 bone frame IFC layer 800 are described in greater detail at later sections.

Figure 9:
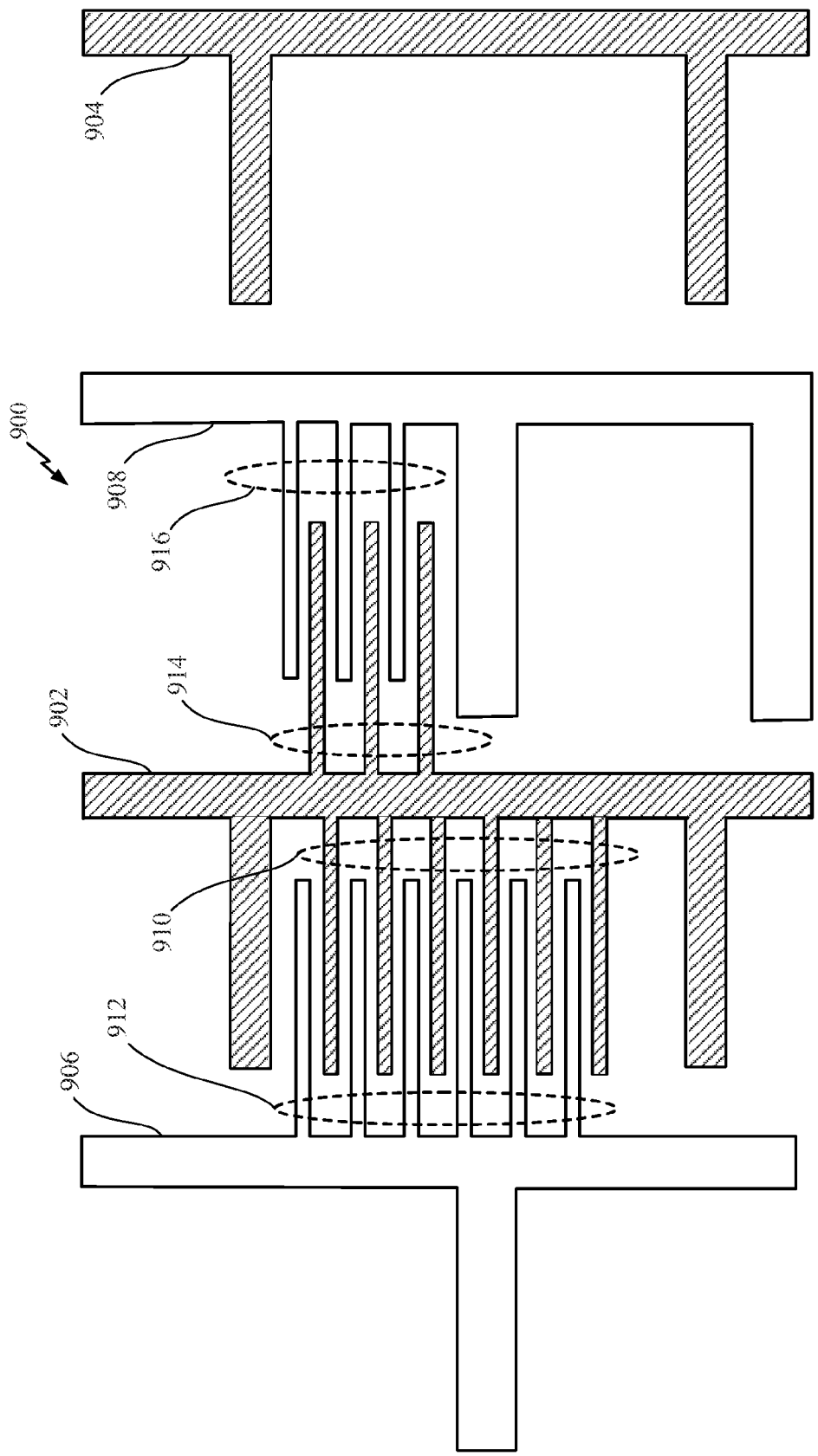
FIG. 9 shows a plan view of one example alternative configuration of bone frames in an IFC layer according to an embodiment.

FIG. 9 shows a plan view of one example alternative bone frame IFC layer 900 according to one or more exemplary embodiments. The bone frame IFC layer 900 may have anode and cathode bone frames arranged such as shown by the FIG. 8 alternative bone frame IFC layer 800. In an aspect, bone frame IFC layer 900 may form a stand-alone bone frame multi-finger capacitor device (not separately labeled). In another aspect, the bone frame IFC layer 900 may form a layer, or a portion of a layer, within a multi-layer MOM orthogonal finger capacitor (abbreviated, as previously described, as "OFC") device in accordance with one or more exemplary embodiments. The FIG. 9 bone frame IFC layer 900 is shown, for purposes of example, as having anode bone frames 902 and 904 and cathode bone frames 906 and 908. For convenient reference in describing the FIG. 9 plan view, the cathode bone frame 906 will be described in relation to the anode bone frame 902, and will therefore be alternatively referenced as the "left neighbor cathode bone frame 906." Similarly, the cathode bone frame 908 will be alternatively referenced as the "right neighbor cathode bone frame 908" in relation to the anode bone frame 902.

According to one aspect, the anode bone frame 902 can have one or more sets of left-to-right extending anode fingers, such as the set of six left-to-right anode fingers 910. One or more of the sets of left-to-right extending anode fingers may extend toward and form a cooperative, interdigitated arrangement a set of right-to-left extending cathode fingers extending from a left neighbor cathode bone frame. An example is shown by the cooperative, interdigitated arrangement of the set of six left-to-right anode fingers 910 and a set of six right-to-left extending cathode fingers 912 extending from the cathode spine (shown but not separately numbered) of the left neighbor cathode bone frame 906.

Continuing to refer to FIG. 9, in a further aspect the anode bone frame 902 may support and connect to one or more sets of right-to-left extending anode fingers, such as the set of three right-to-left anode fingers 914. Further to this aspect, one or more of such sets of right-to-left extending anode fingers may extend from the anode spine of an anode bone frame toward, and form a cooperative, interdigitated arrangement with a set of left-to-right extending cathode fingers extending from a right neighbor cathode bone frame. An example is shown by the cooperative, interdigitated arrangement of the set of three left-to-right anode fingers 914 and a set of three left-to-right extending cathode fingers 916 extending from the cathode spine (shown but not separately numbered) of the right neighbor cathode bone frame 908.

Figure 10:
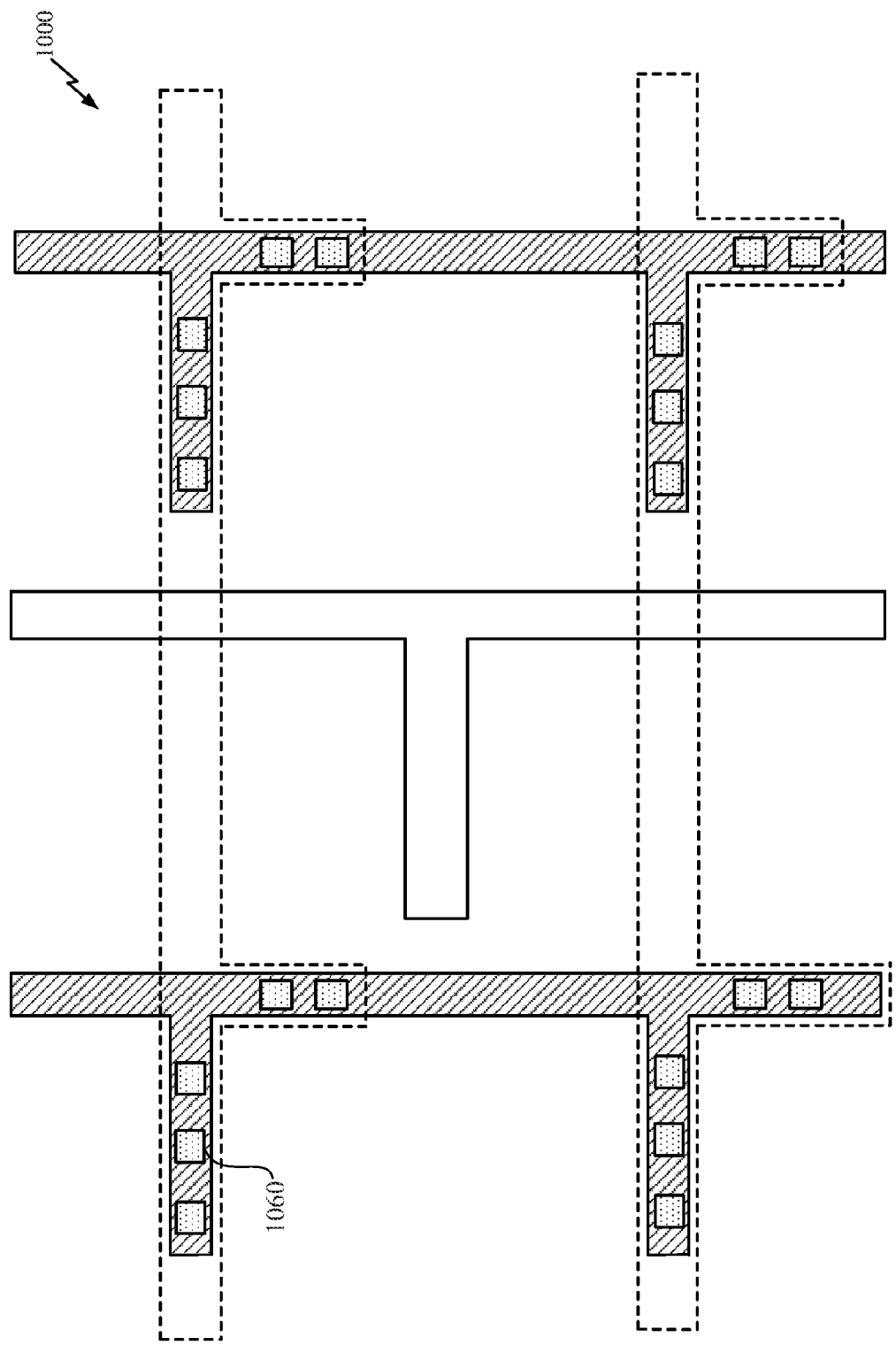
FIG. 10 shows a projection view of another example alternative configuration of bone frames in a bone frame IFC layer of a MOM bone frame OFC, with a superposed dotted line plan view of a via-coupled region of an orthogonal bone frame in an overlaying metal layer, according to an embodiment.

FIG. 10 shows a projection view of another example alternative MOM bone frame structure 1000 that may form a portion of two successive bone frame IFC layers of a MOM bone flame OFC in accordance with one or more exemplary embodiments. FIG. 10 shows structure of one of two successive bone frame IFC layers, for example an overlaying layer, in dotted lines and the other of the layers, for example the underlying layer, in solid lines. It will be understood that this is an arbitrary ordering as which is the overlaying and which is the underlying layer. Referring to FIGS. 10 and 5 together, the MOM bone frame structure 1000 shows vias 1060 in an alternative arrangement and quantity compared to the vias 504. With respect to the X-Y (i.e., left-right/up-down) orientation of the dotted line bone plan view of another example MOM bone frame in the next overlaying metal layer, the FIG. 10 example shows that example MOM bone frame oriented perpendicular to the MOM bone frame in the reference (solid line) metal level.

Figure 11:
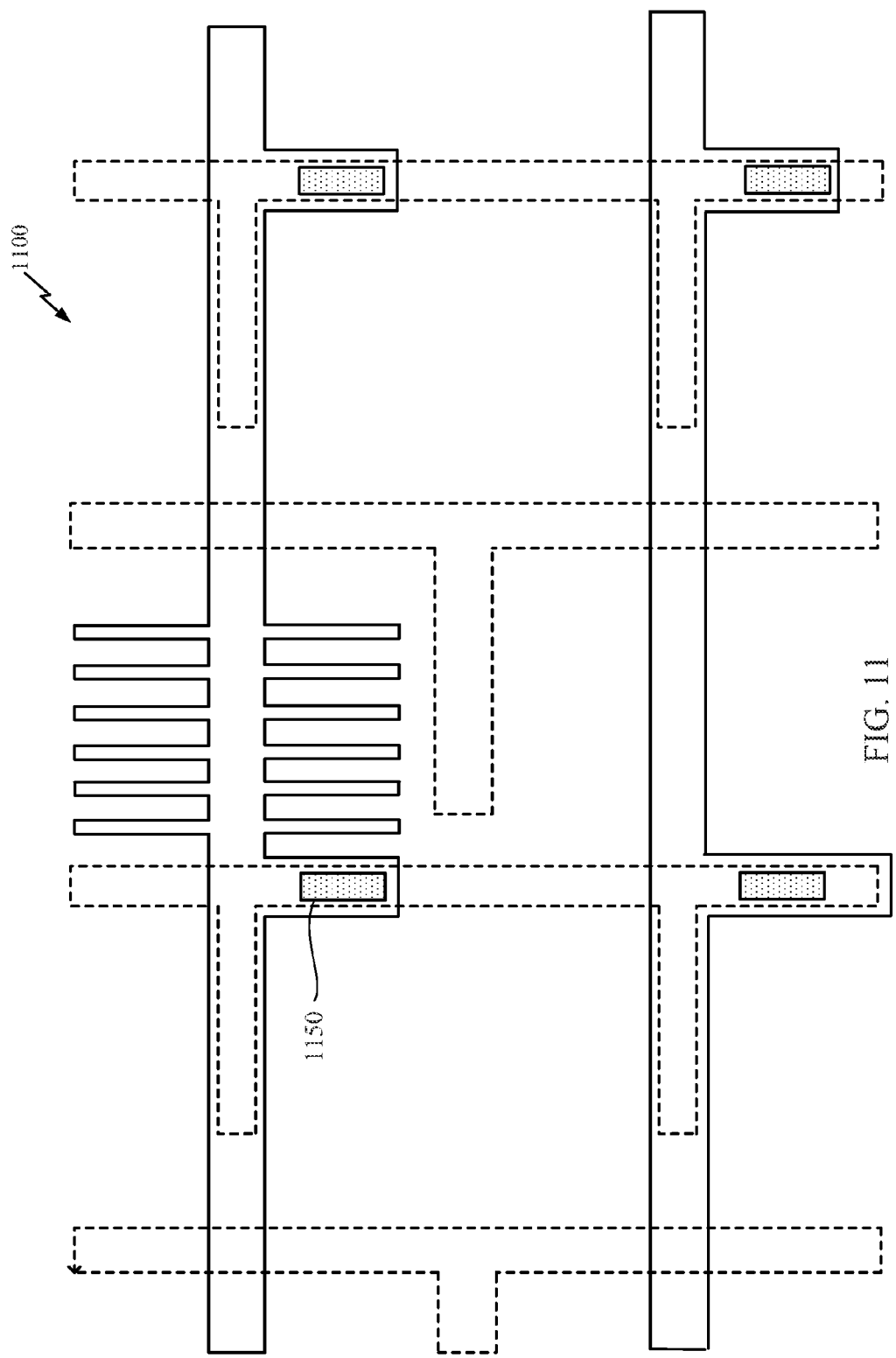
FIG. 11 shows a plan view of one example alternative configuration of bone frames in a bone frame IFC layer of a MOM bone frame OFC, with a superposed dotted line projection of via-coupled regions of example orthogonal bone frames in an overlaying metal layer, according to an embodiment.

FIG. 11 shows a plan view of a portion of alternative two successive bone frame IFC layers 1100, for example for a bone frame OFC device (not shown in FIG. 11) according to one or more exemplary embodiments. The FIG. 11 two successive bone frame IFC layers 1100 employ elongated vias, such as the representative example labeled "1150," that may, for example, substitute for one of, or for two or more of the FIG. 5 vias 504 or 506, or the FIG. 6 vias 604 or 606. The elongated vias 1150 may have a width (not separately labeled) approximately the same as the width of the spine portion(s) or rib portion(s) of the anode bone frame or cathode bone frame that the vias 1150 couple. The elongated vias 1150 may have a length (not separately labeled) along the longitudinal direction of the spine or rib, substantially larger than the example labeled "D14." In an aspect, the elongated vias 1150 may have a length approximately the same as the width of the spine portion(s) or rib portion(s) of the anode bone frame or cathode bone frame that the via couples. Referring to FIGS. 5, 6 and 11 together, it will be appreciated that the vias 1150 may provide a lower resistance, or a reduced population of vias, or both.

Figure 12:
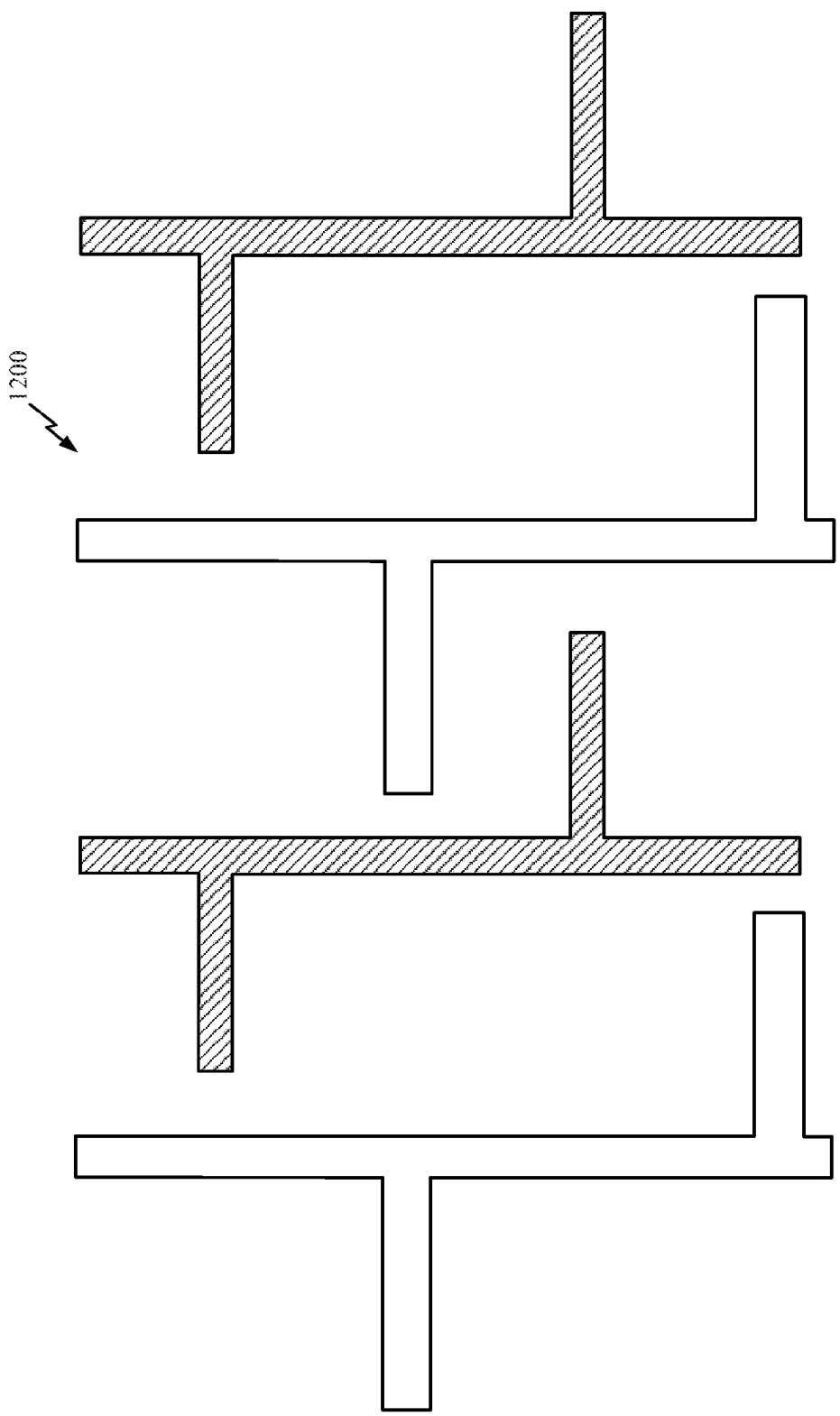
FIG. 12 shows a plan view of a region of another example alternative arrangement of bone frames for a bone frame IFC layer of a MOM bone frame OFC according to an embodiment.

FIG. 12 shows a plan view of a region of another example alternative arrangement 1200 of bone frames for two successive bone frame IFC layers, for example for a bone frame OFC device according to one or more exemplary embodiments. The example alternative arrangement 1200, or portions thereof, may substitute for either the FIG. 6 or FIG. 9 bone frames, or portions thereof.

It will be appreciated by persons of ordinary skill having view of the present disclosure that among various features and advantages that can be provided by exemplary embodiments are increased flexibility for metal fingers, increased options for connecting orthogonal metals from neighboring (in a depth direction) layers, and increased options for connecting metal fingers to outside points.

It will also be appreciated by such persons, having view of the present disclosure, that included among various other features and advantages provided by exemplary embodiments may be improved options, for example, a broader optimal or near-optimal range, for balancing capacitor density and connection resistance.

It will also be appreciated by such persons, having view of the present disclosure, that included among various other features and advantages provided by exemplary embodiments can be more robustness in design options, including but not limited to adjustability of metal bone density. The adjustment of metal bone density can be based on, for example, metal (module) layers and, for small pitch layers which typically have high resistance in both metal and vias, more bones can be used. This can, in turn, lower connection resistance, and help avoid or reduce instances of high finger resistance.

Figure 13:
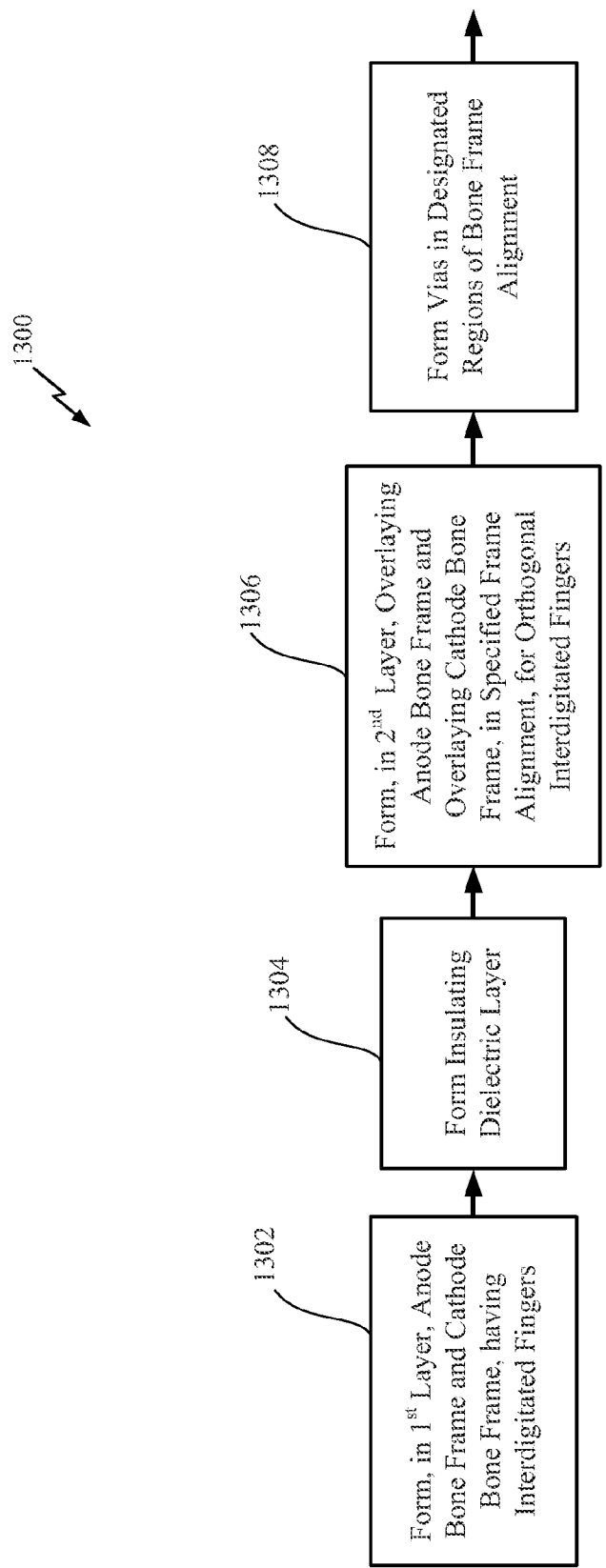
FIG. 13 shows a flow diagram in performing a process in one method for forming a MOM bone frame OFC in accordance with one or more exemplary embodiments.

FIG. 13 shows a flow diagram in performing a process 1300 in one method for forming a bone frame orthogonal finger capacitor in accordance with one or more exemplary embodiments. Operations in a process 1300 according to various embodiments can be readily performed in a conventional semi-conductor fabrication facility, for example by persons of ordinary skill applying to the present disclosure their general knowledge in application-specific adaptation and configuration of conventional processing and fabrication techniques.

Referring to FIG. 13, process 1300 can comprise forming at 1302, in a given layer, an anode bone frame having an anode spine that extends along a longitudinal axis, an anode rib connected to the anode spine, and a set of anode fingers that extends from one of the anode spine and the anode rib. FIG. 3 represents one example of the forming at 1302, including forming the anode bone frame 302_i having an anode spine 310_i that extends along longitudinal axis LN_1, and an anode rib (e.g., either 311_i or 312_i) connected to the anode spine, and a set of anode fingers (e.g., either 313_i or 314_i) that extends from one of the anode spine and the anode rib. The forming at 1302 may also include forming, in the given layer, a cathode bone frame having a cathode spine that extends parallel to the longitudinal axis and having a cathode rib connected to the cathode spine, and a set of cathode fingers that extends from one among the cathode spine and the cathode rib and that is interdigitated with the set of anode fingers. FIG. 3 shows an example result of such forming at 1302, including forming the cathode bone frame 304_i having cathode spine 320_i that extends parallel the longitudinal axis LN_1, and cathode rib 321_i connected to the cathode spine 320_i, and a set of cathode fingers 322_i that extends from the cathode spine 320_i. FIG. 3 shows another example result of such forming at 1302, including forming the second cathode bone frame 304_i+1 having cathode spine 320_i+1, and cathode rib 323_i+1 connected to the cathode spine, and a set of cathode fingers 325_i+1.

The forming as 1302 forms, for the anode bone frame and cathode bone frame, the respective spine and ribs having a width substantially greater than a width of the fingers. In one aspect, the anode fingers may extend from the either the spine or the rib of the anode bone frame, and the cathode fingers may extend from either the spine or the rib of the cathode bone frame. Related to this aspect, the forming orients the respective spines and ribs of the anode and cathode bone frames such that a specified interdigitated arrangement of the anode fingers and cathode fingers is provided. In one specific aspect, the anode fingers may extend from the spine of the anode bone frame, and the cathode fingers may extend from the spine of the cathode bone frame. FIG. 3 shows examples according to this aspect. In another aspect, the anode fingers may extend from the rib of the anode bone frame, and the cathode fingers may extend from the rib of the cathode bone frame.

Referring to FIGS. 13 and 3, operations at 1302 according to the aspect may be, for example, forming anode fingers (not shown) structured relative to one another such as anode fingers 313_i, but extending downward from the anode rib 311_i instead of left-to-right from the anode spine 310_i. Further operations at 1302 according to the aspect may include, for example, forming cathode fingers (not shown) extending upward from the cathode rib 321_i instead of right-to-left from the cathode spine 320_i. According to this aspect, the downward extending anode fingers and upward extending cathode fingers will be interdigitated in a manner substantially the same as the set of anode fingers 313_i and the set of cathode fingers 322_i.

Referring to FIG. 13, in an aspect, operations at 1302 may form the anode bone frame as formed as a first anode bone frame, and the anode spine as a first anode spine that extends parallel to a reference axis. Referring to FIG. 3, one example of such forming may be forming the first anode bone frame 302_i, having the first anode spine 310_i that extends parallel the reference axis LN. Referring to FIG. 13, in a related aspect, the forming at 1302 may form the cathode bone frame as a first cathode bone frame, having a first cathode spine that extends parallel to the reference axis, adjacent the first anode spine. The forming at 1302 may space the first cathode spine by a first distance from the first anode spine in a spacing direction orthogonal to the reference axis, and may form the cathode rib as a first cathode rib, Referring to FIG. 3, one example of such forming may form the first cathode bone frame 304_i, having first cathode spine 320_i that extends along LIN 3 parallel LN. FIG. 3 also shows the first cathode spine 320_i spaced by the distance D4 (or D10 if referring to axes) in a direction orthogonal to LN. Referring to FIG. 13, the forming at 1302 can further include forming a second cathode bone frame in said metal layer, having a second cathode spine that extends parallel to the reference axis, adjacent the first anode spine and spaced by a second distance from the first anode spine in a direction opposite the spacing direction, and having a second cathode rib. Referring to FIG. 3, one example of such forming may be forming the second cathode bone frame 304_i+1, having second cathode spine 320_i+1 that extends along LN _4 parallel LN. FIG. 3 also shows the second cathode spine 320 spaced by the distance D12, if referring to axes, in a direction orthogonal to LN.

Continuing to refer to FIG. 13, operations in a process 1300 can include forming at 1304 an insulating dielectric layer over the anode and cathode bone frame formed at 1302. Operations in process 1300 can further include, at 1306 forming in a second layer overlaying the first layer, a second layer anode bone frame, with an anode spine, an anode rib, and associated anode fingers. The forming at 1306 may also form, in the second layer, a second layer cathode bone frame. The second layer cathode bone frame may have a cathode spine, a cathode rib, and associated cathode fingers that may be interdigitated with the anode fingers supported by the second layer anode bone frame. In a general aspect, operations at 1306 form the second layer anode and cathode bone frame in various alignments with their respective underlying anode and cathode bone frame, for example, as shown in FIGS. 5, 6, 7A, 7B and 7C. These various alignments provide, for example, larger diameter and particularly located vias, as previously described.

Referring to FIG. 13, operations in a process 1300 can then include forming at 1308 vias coupling the second layer anode bone frame to the first layer anode bone frame, and coupling the second layer cathode bone frame to the first layer cathode bone frame. The via forming at 1308 may, for example, form vias coupling the second layer anode spine to a first layer anode rib at a segment where the two are aligned, FIGS. 5 and 6 vias 504 are an example according to this aspect. The via forming at 1308 may, for example, form vias coupling the second layer anode rib to a first layer anode spine at a segment where the two are aligned. FIGS. 5 and 6 vias 506 are an example according to this aspect. The via forming at 1308 may, for example, form vias coupling the second layer cathode spine to a first layer cathode rib at a segment where the two are aligned. FIGS. 5 and 6 vias 604 are an example according to this aspect. The via forming at 1308 may, for example, form vias coupling the second layer cathode rib to a first layer cathode spine at a segment where the two are aligned. FIGS. 5 and 6 vias 606 are an example according to this aspect.

With continuing reference to FIG. 13, the via forming at 1308 may, for example, form vias coupling the second layer anode rib to a first layer anode rib at a segment where the two are aligned. FIG. 7C vias 780, 782 and 784 are examples according to this aspect. The via forming at 1308 may, for example, form vias coupling the second layer cathode rib to a first layer cathode rib at a segment where the two are aligned. FIG. 7C vias 786 and 788 are examples according to this aspect.

Figure 14:
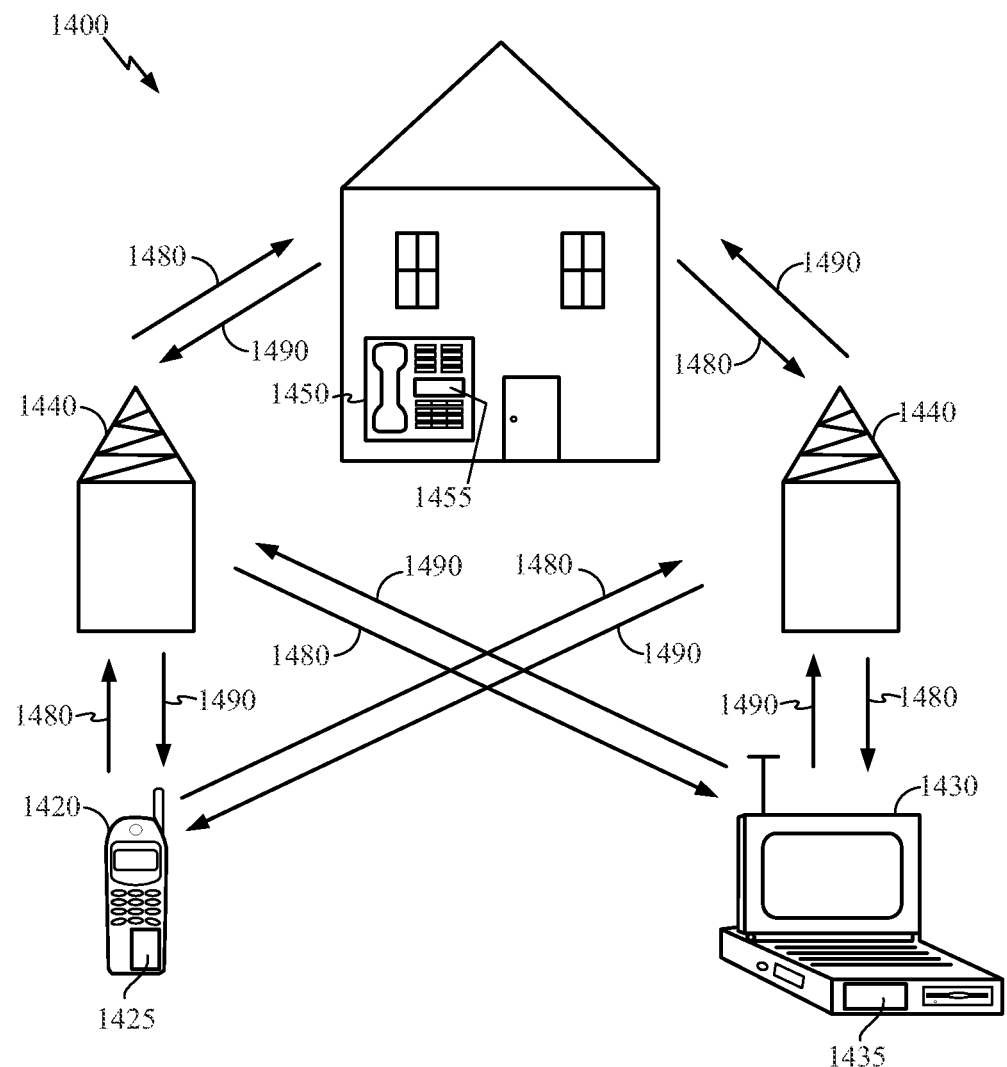
FIG. 14 illustrates an exemplary wireless communication system in which one or more embodiments of the disclosure may be advantageously employed.

FIG. 14 illustrates an exemplary wireless communication system 1400 in which one or more embodiments of the disclosure may be advantageously employed. For purposes of illustration, FIG. 14 shows three remote units 1420, 1430, and 1450 and two base stations 1440. It will be recognized that conventional wireless communication systems may have many more remote units and base stations. The remote units 1420, 1430, and 1450 include semiconductor devices 1425, 1435 and 1455, which are among embodiments of the disclosure as discussed further below. FIG. 14 shows forward link signals 1480 from the base stations 1440 and the remote units 1420, 1430, and 1450 and reverse link signals 1490 from the remote units 1420, 1430, and 1150 to the base stations 1440.

In FIG. 14, the remote unit 1420 is shown as a mobile telephone, the remote unit 1430 is shown as a portable computer, and the remote unit 1450 is shown as a fixed location remote unit in a wireless local loop system. For example, the remote unit may be one or more of a mobile phone, hand-held personal communication systems (PCS) unit, portable data units such as a personal data assistant, navigation devices (such as GPS enabled devices), set top box, music player, video player, entertainment unit, fixed location data unit such as a meter reading equipment, or any other device that stores or retrieves data or computer instructions, or any combination thereof. Although FIG. 14 illustrates remote units according to the teachings of the disclosure, embodiments are not limited to these exemplary illustrated units. For example, embodiments may be employed, in any device that includes at least one semiconductor die having active integrated circuitry including, for example, one or more of memory, logic or analog circuitry, or any combination thereof.

A computer-readable medium according to one embodiment may include a tangible medium storing instructions, which, when executed by a processor apparatus in a semiconductor fabrication system, can cause the processor apparatus to perform operations carrying out a method, for example a method having a flow as described in reference to FIG. 13, for forming an orthogonal finger capacitor in accordance with any exemplary embodiment disclosed herein.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. Further to a general interchangeability of hardware and software, various illustrative components, blocks, modules, and steps have been described above generally in terms of their functionality. It will be understood that whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The invention is not limited to illustrated examples, and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described in, or claimed in the singular, the plural is contemplated unless limitation to the singular is explicitly stated.

What is claimed is:

1. An orthogonal finger capacitor comprising:
    a cathode bone frame having a cathode spine that extends along a longitudinal axis and having a cathode rib that is connected to the cathode spine and extends a cathode rib length from the cathode spine in a first direction, the first direction being transverse to the longitudinal axis;
    a set of cathode fingers that is connected to the cathode spine and extends, in the first direction, from the cathode spine, the cathode spine having a cathode spine width, the cathode rib having a cathode rib width, and cathode fingers in the set of cathode fingers having a cathode finger width, the cathode spine width being greater than the cathode finger width, and the cathode rib width being greater than the cathode finger width;
    an anode bone frame having an anode spine that extends parallel to the longitudinal axis and having an anode rib that is connected to the anode spine and extends from the anode spine in the first direction, the anode spine being spaced a distance, in the first direction, from the cathode spine, the distance being greater than the cathode rib length;
    a set of anode fingers that is connected to the anode spine and extends in a second direction from the anode spine and is interdigitated with the set of cathode fingers, the second direction being opposite the first direction, the anode spine having an anode spine width, and the anode rib having an anode rib width and an anode rib length, anode fingers in the set of anode fingers having an anode finger width, the anode spine width being greater than the anode finger width, and the anode rib width being greater than the anode finger width,
    the anode bone frame, the set of anode fingers, the cathode bone frame and the set of cathode fingers being located in a metal layer;
    an insulating dielectric on the anode bone frame, the set of anode fingers, the cathode bone frame, and the set of cathode fingers;
    an overlaying anode bone frame, in an overlaying metal layer above the insulating dielectric and the metal layer, having an overlaying anode spine and an overlaying anode rib, at least a segment of the overlaying anode rib extending above and in alignment with the anode spine, and at least a segment of the overlaying anode spine extending above and in alignment with the anode rib; and
    an anode via, configured to couple the anode bone frame to the overlaying anode bone frame, the anode via having an anode via width, the anode via width being concurrently greater than the anode finger width, less than the anode spine width, and less than the anode rib width.

2. The orthogonal finger capacitor of claim 1, the anode via being located in the segment of the overlaying anode rib extending above and in alignment with the anode spine.

3. The orthogonal finger capacitor of claim 1, the anode via being located in the segment of the overlaying anode spine extending above and in alignment with the anode rib.

4. The orthogonal finger capacitor of claim 1, the anode via being a first anode via, and the orthogonal finger capacitor further comprising a second anode via, the first anode via being located in the segment of the overlaying anode rib extending above and in alignment with the anode spine, and the second anode via being located in the segment of the overlaying anode spine extending above and in alignment with the anode rib.

5. The orthogonal finger capacitor of claim 1, further comprising:
an overlaying cathode bone frame in the overlaying metal layer, comprising an overlaying cathode spine and an overlaying cathode rib, at least a segment of the overlaying cathode rib extending above and in alignment with the cathode spine, and at least a segment of the overlaying cathode spine extending in alignment with the cathode rib; and
a cathode via, configured to couple the cathode bone frame to the overlaying cathode bone frame, the cathode via having a cathode via width, the cathode via width being concurrently greater than the cathode finger width, less than the cathode spine width, and less than the cathode rib width.

6. The orthogonal finger capacitor of claim 5, further comprising:
an overlaying set of anode fingers that is connected to the overlaying anode spine and extends from the overlaying anode spine, the overlaying set of anode fingers being above the set of anode fingers and extending orthogonal to the first direction;
an overlaying set of cathode fingers that is connected to the overlaying cathode spine and extends from the overlaying cathode spine, in a direction parallel to the overlaying set of anode fingers, the overlaying set of cathode fingers being above the set of cathode fingers, and interdigitated with the overlaying set of anode fingers.

7. The orthogonal finger capacitor of claim 6, the anode via being a first anode via, and the orthogonal finger capacitor further comprising a second anode via,
the first anode via being located in the segment of the overlaying anode rib extending above and in alignment with the anode spine, and the second anode via being located in the segment of the overlaying anode spine that extends above and in alignment with the anode rib, wherein the cathode via being a first cathode via, and the orthogonal finger capacitor further comprising a second cathode via, the first cathode via being located in the segment of the overlaying cathode rib extending above and in alignment with the cathode spine, and the second cathode via being located in the segment of the overlaying cathode spine extending above and in alignment with the cathode rib.

8. The orthogonal finger capacitor of claim 1, wherein the orthogonal finger capacitor is integrated in at least one semiconductor die.

9. The orthogonal finger capacitor of claim 1, further comprising a device, selected from the group consisting of a set top box, music player, video player, entertainment unit, navigation device, communication device, personal digital assistant (PDA), fixed location data unit, and a computer, into which the orthogonal finger capacitor is integrated.

10. The orthogonal finger capacitor of claim 1, the set of anode fingers being a first set of anode fingers, the orthogonal finger capacitor further comprising a second set of anode fingers, the second set of anode fingers being connected to the anode spine and extending, in the first direction, from the anode spine, anode fingers in the second set of anode fingers having a width, the width being concurrently less than the anode spine width and less than the anode rib width.

11. The orthogonal finger capacitor of claim 1, the cathode fingers being configured to have, in addition to the cathode finger width, a cathode finger length, the cathode finger length being in the first direction, the cathode rib length being approximately the cathode finger length.

12. The orthogonal finger capacitor of claim 1, the cathode fingers being configured to have, in addition to the cathode finger width, a cathode finger length, the cathode finger length being in the first direction, the cathode rib length being equal to the cathode finger length.

13. The orthogonal finger capacitor of claim 1, the cathode fingers being configured to have, in addition to the cathode finger width, a cathode finger length, the anode fingers being configured to have, in addition to the anode finger width, an anode finger length, the anode finger length being equal to the cathode finger length.

14. A method for forming an orthogonal finger capacitor comprising:
forming in a metal layer
a cathode bone frame having a cathode spine that extends along a longitudinal axis, and having a cathode rib that is connected to the cathode spine and extends a cathode rib length from the cathode spine, in a first direction, and the first direction being transverse to the longitudinal axis;
a set of cathode fingers that is connected to the cathode spine and extends, in the first direction, from the cathode spine, the cathode spine having a cathode spine width, the cathode rib having a cathode rib width, and cathode fingers in the set of cathode fingers having a cathode finger width, the cathode spine width being greater than the cathode finger width, and the cathode rib width being greater than the cathode finger width;
an anode bone frame having an anode spine that extends parallel to the longitudinal axis and having an anode rib that is connected to the anode spine and extends from the anode spine, in the first direction, the anode spine being spaced a distance, in the first direction, from the cathode spine, the distance being greater than the cathode rib length; and
a set of anode fingers that is connected to the anode spine and extends in a second direction from the anode spine and is interdigitated with the set of cathode fingers, the second direction being opposite the first direction, the anode spine having an anode spine width, the anode rib having an anode rib width, and anode fingers in the set of anode fingers having an anode finger width, the anode spine width being greater than the anode finger width, and the anode rib width being greater than the anode finger width;
forming an insulating dielectric on the anode bone frame, the set of anode fingers, the cathode bone frame, and the set of cathode fingers;
forming, in an overlaying metal layer above the insulating dielectric, an overlaying anode bone frame, the overlaying anode bone frame including an overlaying anode spine and an overlaying anode rib, at least a segment of the overlaying anode rib extending above and in alignment with the anode spine, and at least a segment of the overlaying anode spine extending above and in alignment with the anode rib; and
forming an anode via, in a configuration coupling the anode bone frame to the overlaying anode bone frame, the anode via having an anode via width, the anode via width being concurrently greater than the anode finger width, less than the anode spine width, and less than the anode rib width.

15. The method of claim 14, the anode via being a first anode via, and forming the orthogonal finger capacitor comprising forming the first anode via at a location in the segment of the overlaying anode rib extending above and in alignment with the anode spine, and the method further comprising forming a second anode via, the second anode via being located in the segment of the overlaying anode spine extending above and in alignment with the anode rib.

16. The method of claim 14, further comprising:
    forming an overlaying cathode bone frame in the overlaying metal layer, the overlaying cathode bone frame including an overlaying cathode spine and an overlaying cathode rib that is connected to the overlaying cathode spine, at least a segment of the overlaying cathode rib extending above and in alignment with the cathode spine, and at least a segment of the overlaying cathode spine extending above and in alignment with the cathode rib; and
    forming a cathode via, in a configuration coupling the cathode bone frame to the overlaying cathode bone frame, the cathode via having a cathode via width, the cathode via width being concurrently greater than the cathode finger width, less than the cathode spine width, and less than the cathode rib width.

17. The method of claim 16, further comprising:
    forming an overlaying set of anode fingers that is connected to the overlaying anode spine and extends from the overlaying anode spine, the overlaying set of anode fingers being above the set of anode fingers, and extending orthogonal to the first direction; and
    forming an overlaying set of cathode fingers that is connected to the overlaying cathode spine and extends from the overlaying cathode spine, in a direction parallel to the overlaying set of anode fingers, the overlaying set of cathode fingers being above the set of cathode fingers, and interdigitated with the overlaying set of anode fingers.

18. The method of claim 14, the set of anode fingers being a first set of anode fingers, the orthogonal finger capacitor further comprising a second set of anode fingers, the second set of anode fingers being connected to the anode spine and extending, in the first direction, from the anode spine, anode fingers in the second set of anode fingers having a width, the width being concurrently less than the anode spine width and less than the anode rib width.

19. The method of claim 14, the cathode fingers being formed to have, in addition to the cathode finger width, a cathode finger length, the cathode finger length being in the first direction, the cathode rib length being approximately the cathode finger length.

20. The method of claim 14, the cathode fingers being formed to have, in addition to the cathode finger width, a cathode finger length, the cathode finger length being in the first direction, and the cathode rib length being equal to the cathode finger length.

21. A method for forming an orthogonal finger capacitor comprising:
    step of forming a cathode bone frame having a cathode spine that extends along a longitudinal axis, and having a cathode rib that is connected to the cathode spine and extends a cathode rib length from the cathode spine, in a first direction, the first direction being transverse to the longitudinal axis;
    step of forming a set of cathode fingers that is connected to the cathode spine and extends, in the first direction, from the cathode spine, the cathode spine having a cathode spine width, the cathode rib having a cathode rib width, and cathode fingers in the set of cathode fingers having a cathode finger width, the cathode spine width being greater than the cathode finger width, and the cathode rib width being greater than the cathode finger width;
    step of forming an anode bone frame having an anode spine that extends parallel to the longitudinal axis and having an anode rib that is connected to the anode spine and extends from the anode spine in the first direction, the anode spine being spaced a distance, in the first direction, from the cathode spine;
    step of forming a set of anode fingers that is connected to the anode spine and extends in a second direction from the anode spine and is interdigitated with the set of cathode fingers, the second direction being opposite the first direction, the anode spine having an anode spine width, the anode rib having an anode rib width, and anode fingers in the set of anode fingers having an anode finger width, the anode spine width being greater than the anode finger width, and the anode rib width being greater than the anode finger width;
    step of forming an insulating dielectric on the anode bone frame, the set of anode fingers, the cathode bone frame, and the set of cathode fingers;
    step of forming an overlaying anode bone frame, in an overlaying metal layer above the insulating dielectric, the overlaying anode bone frame including an overlaying anode spine and an overlaying anode rib, at least a segment of the overlaying anode rib extending above and in alignment with the anode spine, and at least a segment of the overlaying anode spine extending above and in alignment with the anode rib; and
    step of forming an anode via, in a configuration coupling the anode bone frame to the overlaying anode bone frame, the anode via having an anode via width, the anode via width being concurrently greater than the anode finger width, less than the anode spine width, and less than the anode rib width.

22. A computer program product comprising a tangible non-transitory computer readable storage medium, encoded with processor readable instructions that, when executed by a processor, cause the processor to perform a method for forming an orthogonal finger capacitor, the method comprising:
    forming in a metal layer
        a cathode bone frame having a cathode spine that extends along a longitudinal axis, and having a cathode rib that is connected to the cathode spine and extends a cathode rib length from the cathode spine, in a first direction, the first direction being transverse to the longitudinal axis;
        a set of cathode fingers that is connected to the cathode spine and extends, in the first direction, from the cathode spine, the cathode spine having a cathode spine width, the cathode rib having a cathode rib width, and cathode fingers in the set of cathode fingers having a cathode finger width, the cathode spine width being greater than the cathode finger width, and the cathode rib width being greater than the cathode finger width;
        an anode bone frame having an anode spine that extends parallel to the longitudinal axis and having an anode rib that is connected to the anode spine and extends from the anode spine in the first direction, the anode spine being spaced a distance, in the first direction, from the cathode spine, the distance being greater than the cathode rib length; and
        a set of anode fingers that is connected to the anode spine and extends in a second direction from the anode spine and is interdigitated with the set of cathode fingers, the second direction being opposite the first direction, the anode spine having an anode spine width, the anode rib having an anode rib width, and anode fingers in the set of anode fingers having an anode finger width, the anode spine width being greater than the anode finger width, and the anode rib width being greater than the anode finger width;

forming an insulating dielectric on the anode bone frame, the set of anode fingers, the cathode bone frame, and the set of cathode fingers;

forming, in an overlaying metal layer above the insulating dielectric, an overlaying anode bone frame, the overlaying anode bone frame including an overlaying anode spine and an overlaying anode rib, at least a segment of the overlaying anode rib extending above and in alignment with the anode spine, and at least a segment of the overlaying anode spine extending above and in alignment with the anode rib; and forming an anode via, in a configuration coupling the anode bone frame to the overlaying anode bone frame, the anode via having an anode via width, the anode via width being concurrently greater than the anode finger width, less than the anode spine width, and less than the anode rib width.

* * * * *